(12) United States Patent
Ogura

(10) Patent No.: US 11,387,273 B2
(45) Date of Patent: Jul. 12, 2022

(54) PHOTOELECTRIC CONVERSION DEVICE, METHOD OF MANUFACTURING PHOTOELECTRIC CONVERSION DEVICE, IMAGING SYSTEM, AND IMAGE READING APPARATUS

(71) Applicant: CANON KABUSHIKI KAISHA, Tokyo (JP)

(72) Inventor: Masanori Ogura, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 94 days.

(21) Appl. No.: 16/780,468

(22) Filed: Feb. 3, 2020

(65) Prior Publication Data

US 2020/0273899 A1     Aug. 27, 2020

(30) Foreign Application Priority Data

Feb. 27, 2019   (JP) .............................. JP2019-033885

(51) Int. Cl.
*H01L 27/146* (2006.01)
*H04N 5/232* (2006.01)
*H04N 1/00* (2006.01)

(52) U.S. Cl.
CPC .... *H01L 27/14627* (2013.01); *H01L 27/1463* (2013.01); *H01L 27/14621* (2013.01);
(Continued)

(58) Field of Classification Search
CPC ......... H01L 27/14627; H01L 27/14621; H01L 27/1463; H01L 27/14636; H01L 27/14645;
(Continued)

(56) References Cited

U.S. PATENT DOCUMENTS

| 5,315,101 A | 5/1994 | Hughes |
| 7,227,208 B2 | 6/2007 | Ogura |

(Continued)

FOREIGN PATENT DOCUMENTS

| JP | 2000-101058 | 4/2000 |
| JP | 2005-183600 | 7/2005 |

(Continued)

OTHER PUBLICATIONS

U.S. Appl. No. 16/701,008, filed Dec. 2, 2019 by Masanori Ogura.
U.S. Appl. No. 16/866,847, filed May 5, 2020 by Hiroki Hiyama.

*Primary Examiner* — Tony Ko
(74) *Attorney, Agent, or Firm* — Venable LLP

(57) ABSTRACT

A photoelectric conversion device includes: a pixel region in which pixels each including a photoelectric converter is arranged, and micro-lenses corresponding to the pixels. The pixel region includes adjacent first and second regions, a first pixel in the first region and a second pixel in the second region adjacent in a direction in which the first and second regions are aligned are arranged at a first arrangement pitch, two pixels in the first region adjacent in the direction are arranged at a second arrangement pitch, two pixels in the second region adjacent in the direction are arranged at a third arrangement pitch, the second and third arrangement pitches are smaller than the first arrangement pitch, and an arrangement pitch of two micro-lenses corresponding to the pixel in the first regions and the pixel in the second region that are adjacent is smaller than the first arrangement pitch.

47 Claims, 15 Drawing Sheets

(52) U.S. Cl.
CPC .. *H01L 27/14636* (2013.01); *H01L 27/14645* (2013.01); *H01L 27/14685* (2013.01); *H04N 1/00795* (2013.01); *H04N 5/23229* (2013.01)

(58) Field of Classification Search
CPC ......... H01L 27/14685; H01L 27/14609; H01L 27/14603; H01L 27/14643; H01L 27/14687; H04N 1/00795; H04N 5/23229; H04N 5/3745
See application file for complete search history.

(56) References Cited

U.S. PATENT DOCUMENTS

| | | |
|---|---|---|
| 7,321,110 B2 | 1/2008 | Okita |
| 7,408,210 B2 | 8/2008 | Ogura |
| 7,456,880 B2 | 11/2008 | Okita |
| 7,460,162 B2 | 12/2008 | Koizumi |
| 7,514,732 B2 | 4/2009 | Okita |
| 7,550,793 B2 | 6/2009 | Itano |
| 7,605,415 B2 | 10/2009 | Koizumi |
| 7,629,568 B2 | 12/2009 | Koizumi |
| 7,638,826 B2 | 12/2009 | Hiyama |
| 7,679,658 B2 | 3/2010 | Sakurai |
| 7,719,587 B2 | 5/2010 | Ogura |
| 7,808,537 B2 | 10/2010 | Fujimura |
| 7,812,873 B2 | 10/2010 | Hiyama |
| 7,812,876 B2 | 10/2010 | Hiyama |
| 7,906,755 B2 | 3/2011 | Koizumi |
| 7,907,196 B2 | 3/2011 | Ogura |
| 7,943,975 B2 | 5/2011 | Koizumi |
| 7,948,540 B2 | 5/2011 | Ogura |
| 7,978,241 B2 | 7/2011 | Koizumi |
| 8,053,718 B2 | 11/2011 | Koizumi |
| 8,063,958 B2 | 11/2011 | Okita |
| 8,134,190 B2 | 3/2012 | Okita |
| 8,169,525 B2 | 5/2012 | Ryoki |
| 8,174,600 B2 | 5/2012 | Ogura |
| 8,207,561 B2 | 6/2012 | Koizumi |
| 8,218,050 B2 | 7/2012 | Ogura |
| 8,390,708 B2 | 3/2013 | Koizumi |
| 8,411,178 B2 | 4/2013 | Ogura |
| 8,416,329 B2 | 4/2013 | Hiyama |
| 8,441,558 B2 | 5/2013 | Okita |
| 8,477,224 B2 | 7/2013 | Ogura |
| 8,493,487 B2 | 7/2013 | Takada |
| 8,520,102 B2 | 8/2013 | Ogura |
| 8,520,108 B2 | 8/2013 | Ogura |
| 8,552,481 B2 | 10/2013 | Hiyama |
| 8,624,307 B2 | 1/2014 | Koizumi |
| 8,643,765 B2 | 2/2014 | Takada |
| 8,698,935 B2 | 4/2014 | Okita |
| 8,749,675 B2 | 6/2014 | Koizumi |
| 8,823,849 B2 | 9/2014 | Hiyama |
| 8,896,029 B2 | 11/2014 | Koizumi |
| 8,928,790 B2 | 1/2015 | Ogura |
| 9,124,830 B2 | 9/2015 | Ogura |
| 9,231,022 B2 | 1/2016 | Hiyama |
| 9,305,954 B2 | 4/2016 | Kato |
| 9,324,750 B2 | 4/2016 | Ishii |
| 9,595,559 B2 | 3/2017 | Hiyama |
| 10,225,496 B2 | 3/2019 | Ogura |
| 2005/0174552 A1 | 8/2005 | Takada |
| 2011/0102651 A1* | 5/2011 | Tay ............... H01L 27/14687 348/280 |
| 2011/0169996 A1 | 7/2011 | Takada |
| 2012/0159945 A1 | 7/2012 | Okita |
| 2013/0009038 A1 | 1/2013 | Ishii |
| 2015/0357368 A1 | 12/2015 | Kimura |
| 2016/0005788 A1 | 1/2016 | Ogura |
| 2016/0284759 A1 | 9/2016 | Kimura |
| 2017/0133417 A1 | 5/2017 | Hiyama |

FOREIGN PATENT DOCUMENTS

| | | |
|---|---|---|
| JP | 2005-223707 | 8/2005 |
| JP | 2013-16608 | 1/2013 |
| JP | 2014-90088 | 5/2014 |

* cited by examiner

PHOTOELECTRIC CONVERSION DEVICE, METHOD OF MANUFACTURING PHOTOELECTRIC CONVERSION DEVICE, IMAGING SYSTEM, AND IMAGE READING APPARATUS

BACKGROUND OF THE INVENTION

Field of the Invention

The present invention relates to a photoelectric conversion device and a method of manufacturing the same, an imaging system, and an image reading apparatus.

Description of the Related Art

In manufacturing of semiconductor devices, a predetermined process on a semiconductor substrate is performed by using a resist pattern formed by exposing and developing a pattern of a photomask (reticle). In a semiconductor device whose chip size is larger than an effective exposure area of an exposure equipment, exposure of a pattern on the whole chip region is performed by dividing the chip region into a plurality of areas, individually exposing each area, and connecting the areas to each other. Such an exposure method is referred to as stitching exposure or divisional exposure. Among semiconductor devices, a photoelectric conversion device represented by an imaging device in particular has an increased chip size due to the increased area of an imaging region, and therefore stitching exposure may often be required.

Japanese Patent Application Laid-Open No. 2013-016608 discloses that local unevenness of imaging characteristics caused by stitching exposure is suppressed by changing the pattern shape of a metal interconnection in pixels near the boundary of stitching exposure. Further, Japanese Patent Application Laid-Open No. 2005-223707 discloses that local unevenness of imaging characteristics caused by stitching exposure is suppressed by arranging the boundary of stitching exposure at the approximate center of the imaging region in which the angle of light entering an imaging element is substantially perpendicular to an imaging plane.

The method disclosed in Japanese Patent Application Laid-Open No. 2013-016608 is to change in advance the pattern shape of the metal interconnection of the pixel near the boundary of stitching exposure. When manufacturing a large number of imaging elements, however, exposure is not always performed in the same manner near the boundary of stitching exposure. Thus, the method disclosed in Japanese Patent Application Laid-Open No. 2013-016608 is not necessarily a substantial countermeasure, and when the adjustment is directed contrarily against expectation, evenness of pixel characteristics may rather be reduced.

Further, according to the method disclosed in Japanese Patent Application Laid-Open No. 2005-223707, it is possible to suppress local unevenness of imaging characteristics caused at the boundary of stitching exposure due to the angle of light entering the imaging element. In Japanese Patent Application Laid-Open No. 2005-223707, however, it is not possible to suppress unevenness of imaging characteristics or reduction in a process margin due to a change of pixel size caused by misalignment in stitching exposure.

SUMMARY OF THE INVENTION

The object of the present invention is to provide an advantageous technology in providing a photoelectric conversion device with excellent evenness of pixel characteristics and a method of manufacturing the same.

According to one aspect of the present invention, provided is a photoelectric conversion device including: a pixel region in which a plurality of pixels each including a photoelectric converter are arranged, and a plurality of micro-lenses each corresponding to each of the plurality of pixels, and the pixel region includes a first region and a second region that are adjacent to each other, wherein out of the plurality of pixels, a first pixel in the first region and a second pixel in the second region that are adjacent to each other in a direction in which the first region and the second region are aligned are arranged at a first arrangement pitch, wherein out of the plurality of pixels, two pixels in the first region that are adjacent to each other in the direction are arranged at a second arrangement pitch, wherein out of the plurality of pixels, two pixels in the second region that are adjacent to each other in the direction are arranged at a third arrangement pitch, wherein the second arrangement pitch and the third arrangement pitch are smaller than the first arrangement pitch, and wherein out of the plurality of micro-lenses, an arrangement pitch of two micro-lenses corresponding to the pixel in the first region and the pixel in the second region that are adjacent to each other is smaller than the first arrangement pitch. Further, according to another aspect of the present invention, provided is a photoelectric conversion device including a pixel region in which a plurality of pixels each including a photoelectric converter are arranged, and a plurality of micro-lenses each corresponding to each of the plurality of pixels, wherein the pixel region includes a first region and a second region that are adjacent to each other, wherein out of the plurality of pixels, a first pixel in the first region and a second pixel in the second region that are adjacent to each other in a direction in which the first region and the second region are aligned are arranged at a first arrangement pitch, wherein out of the plurality of pixels, two pixels in the first region that are adjacent to each other in the direction are arranged at a second arrangement pitch, wherein out of the plurality of pixels, two pixels in the second region that are adjacent to each other in the direction are arranged at a third arrangement pitch, wherein the second arrangement pitch and the third arrangement pitch are smaller than the first arrangement pitch, wherein out of the plurality of micro-lenses, an arrangement pitch of two micro-lenses corresponding to the two pixels in the first region that are adjacent to each other is smaller than the second arrangement pitch, and wherein out of the plurality of micro-lenses, an arrangement pitch of two micro-lenses corresponding to the two pixels in the second region that are adjacent to each other is smaller than the third arrangement pitch.

Further, according to yet another aspect of the present invention, provided is a method of manufacturing a photoelectric conversion device comprising: performing a pattern exposure of the same layer by using separate photomasks on a first region and a second region that are adjacent to each other to form a plurality of pixels each including a photoelectric converter and a plurality of micro-lenses each corresponding to each of the plurality of pixels in a pixel region including the first region and the second region, wherein a photomask used for performing pattern exposure on the first region and a photomask used for performing pattern exposure on the second region are designed such that a pixel in the first region and a pixel in the second region that are adjacent to each other in a direction in which the first region and the second region are aligned are arranged at a first arrangement pitch, two pixels in the first region that are adjacent to each other in the direction are arranged at a second arrangement pitch that is smaller than the first arrangement pitch, two pixels in the second region that are adjacent to each other in the direction are arranged at a third arrangement pitch that is smaller than the first arrangement pitch, and out of the plurality of micro-lenses, an arrangement pitch of two micro-lenses corresponding to the pixel in the first region and the pixel in the second region that are adjacent to each other is smaller than the first arrangement pitch.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
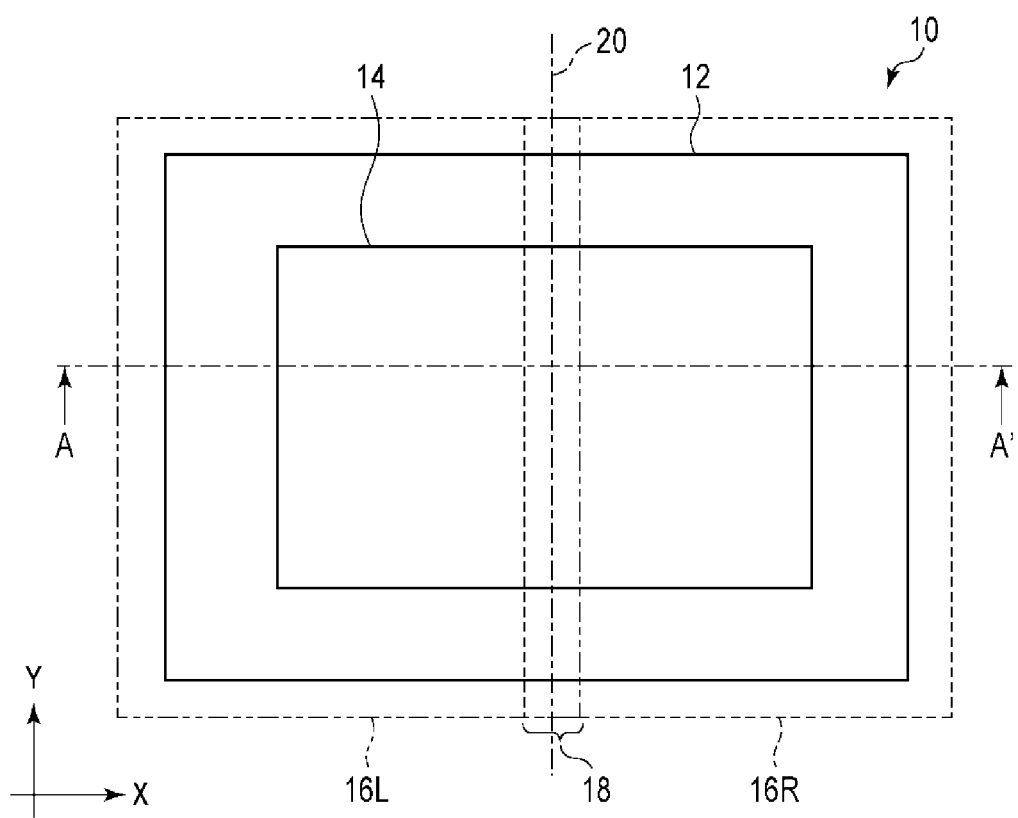
FIG. 1 is a plan view of a photoelectric conversion device according to a first embodiment of the present invention.
Figure 2:
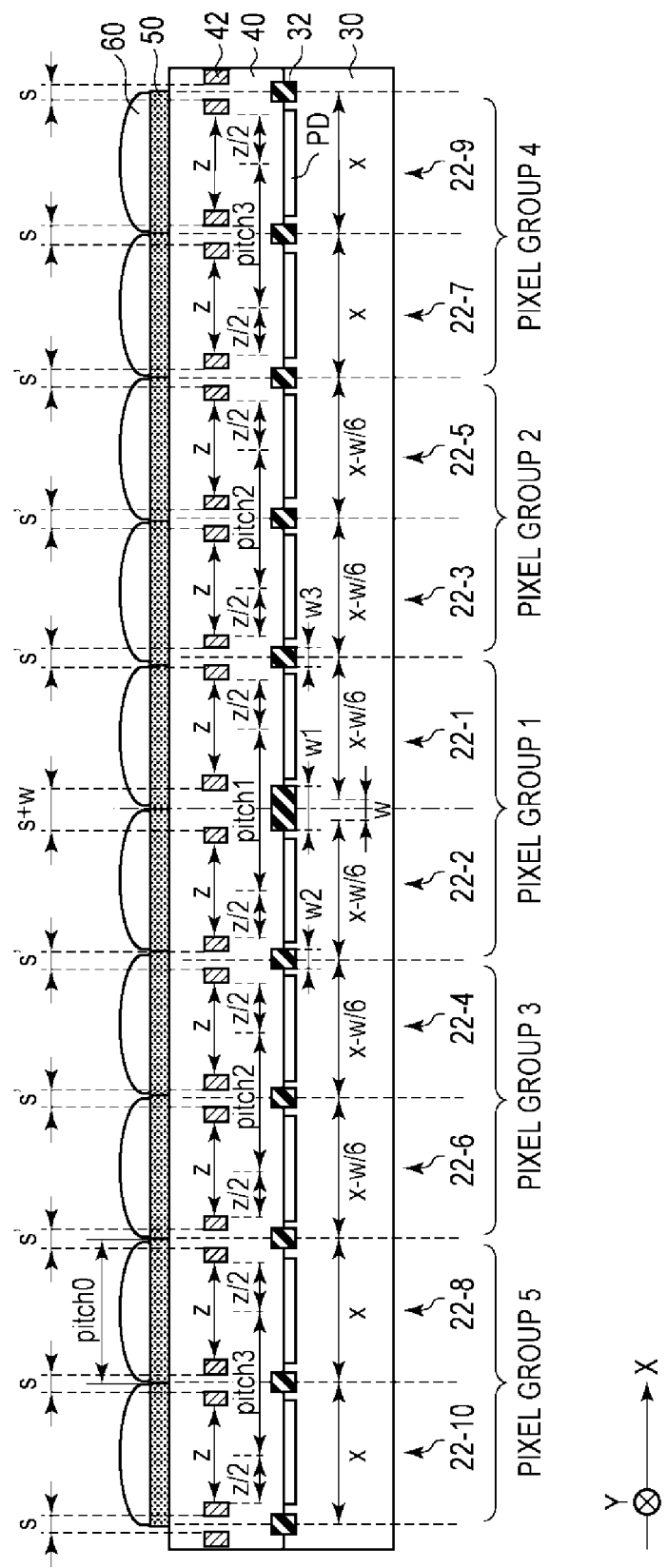
FIG. 2 is a schematic cross-sectional view of the photoelectric conversion device according to the first embodiment of the present invention.
Figure 3:
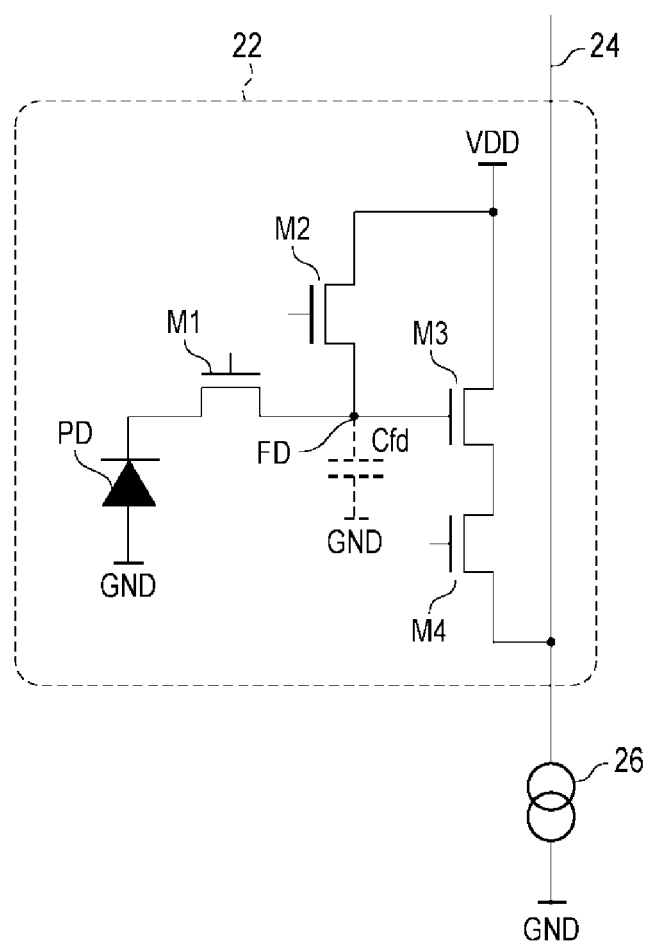
FIG. 3 is a circuit diagram of a pixel of the photoelectric conversion device according to the first embodiment of the present invention.
Figure 4:
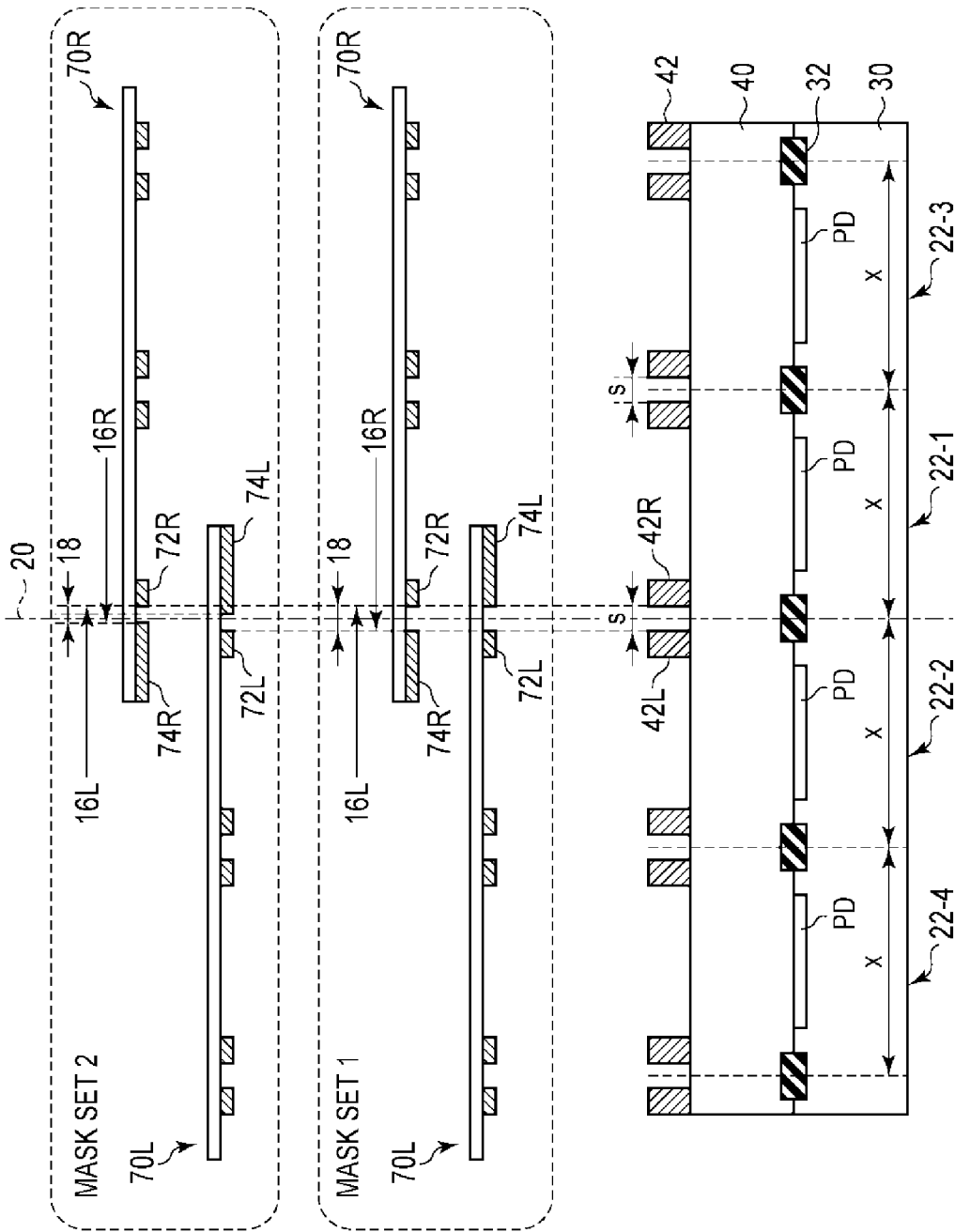
FIG. 4 is a schematic diagram illustrating examples of mask sets used for manufacturing a photoelectric conversion device according to a comparative example.
Figure 5:
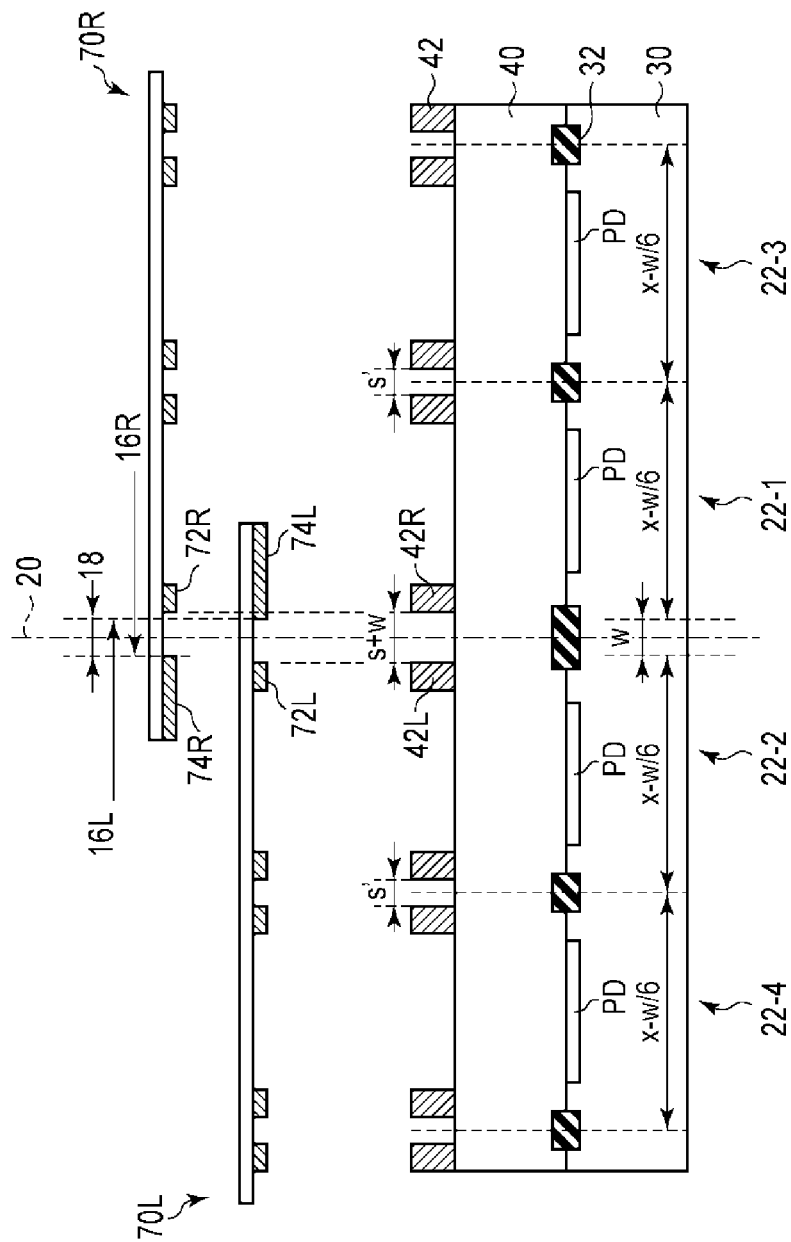
FIG. 5 is a schematic diagram illustrating an example of a mask set used for manufacturing the photoelectric conversion device according to the first embodiment of the present invention.
Figure 6:
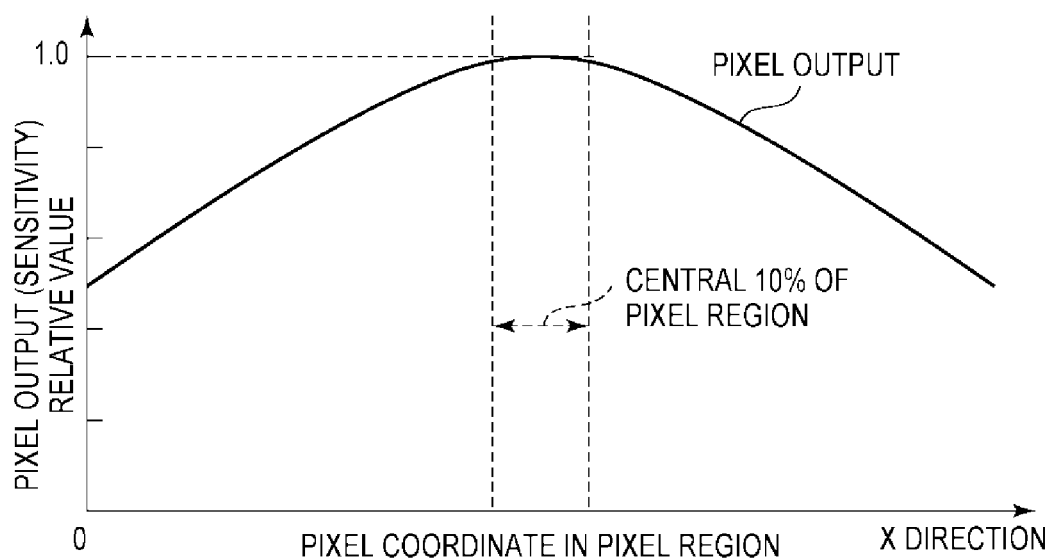
FIG. 6 is a graph illustrating a relationship between a position and output of the pixel in a pixel region.

A photoelectric conversion device and a method of manufacturing the same according to a first embodiment of the present invention will be described with reference to FIG. 1 to FIG. 6. FIG. 1 is a plan view of the photoelectric conversion device according to the present embodiment. FIG. 2 is a schematic cross-sectional view of the photoelectric conversion device according to the present embodiment. FIG. 3 is a circuit diagram of a pixel of the photoelectric conversion device according to the present embodiment. FIG. 4 is a schematic diagram illustrating examples of mask sets used for manufacturing a photoelectric conversion device according to a comparative example FIG. 5 is a schematic diagram illustrating an example of a mask set used for manufacturing the photoelectric conversion device according to the present embodiment. FIG. 6 is a graph illustrating a relationship between a position and output of the pixel in a pixel region.

First, a general configuration of the photoelectric conversion device according to the present embodiment will be described with reference to FIG. 1 to FIG. 3.

FIG. 1 illustrates an overview of a chip region 10 on a semiconductor substrate on which the photoelectric conversion device according to the present embodiment is formed. The chip region 10 here is a region on a semiconductor substrate corresponding to a chip size of the photoelectric conversion device. The chip region 10 includes a device forming region 12 and, in addition, all regions in which patterns required for the functions, manufacturing, inspection, or the like of the photoelectric conversion device are formed, such as a process pattern-forming region of an alignment mark, a misalignment inspection mark, or the like.

A pattern formation over the semiconductor substrate is performed by using photolithography. After a photoresist film is formed over the semiconductor substrate, a predetermined pattern is exposed to the formed photoresist film by using an exposure equipment, the exposed photoresist film is developed, and thereby the exposed pattern is transferred to the photoresist film. The patterned photoresist film may be used as a mask used for etching a semiconductor substrate or a film deposited over the semiconductor substrate or a mask used for ion implantation, for example. It is also possible to use the patterned photoresist film as an alignment mark in the subsequent photolithography process.

The exposure equipment has a specific effective exposure area. The effective exposure area is the maximum region that can be exposed once in one shot and is determined in accordance with the performance of the projection optical system of the exposure equipment. When an exposure equipment in which the size of the effective exposure area is smaller than the size of the chip region 10 of the photoelectric conversion device is used, it is required to divide the chip region 10 into a plurality of areas that are smaller than the effective exposure area of the exposure equipment and to individually expose a pattern corresponding to each of the divided areas.

FIG. 1 illustrates an example in which two exposure areas aligned in the X direction are defined in the chip region 10 and a predetermined pattern is exposed on the entire chip region 10 by performing exposure twice. To simplify the illustration below, the left exposure area in FIG. 1 is referred to as a left exposure area 16L, and the right exposure area in FIG. 1 is referred to as a right exposure area 16R. Note that the number of times of divisional exposure when a predetermined pattern is exposed on the entire chip region 10 is not limited to two and may be three or more. Further, a division direction of the exposure area (a direction to align the exposure areas) is not limited to the X direction but may be the Y direction or two directions of the X direction and the Y direction. Note that the X direction is a direction along a pixel row of pixels arranged in a matrix in the pixel region 14, for example. Further, the Y direction is a direction along a pixel column of pixels arranged in a matrix in the pixel region 14, for example.

The length of the chip region 10 in the X direction (length of the semiconductor substrate after dicing in the X direction) may be longer than 35 mm. The length of the chip region 10 in the X direction may be around 40 mm to 50 mm, for example. The length of the pixel region 14 in the X direction may be longer than 33 mm. The length of the pixel region 14 in the X direction may be around 34 mm to 45 mm, for example.

The effective exposure area of a general exposure equipment is 26 mm by 33 mm. Since it is costly to introduce an exposure equipment that can expose a larger exposure area, stitching exposure is useful for performing exposure exceeding the range of 26 mm by 33 mm at low cost. By using stitching exposure, it is also possible to perform pattern exposure with line sensors, 35 mm full size sensors (pixel area: 36±1 mm×24±1 mm), medium format sensors (pixel area: 44±1 mm×33±1 mm) provided on an elongated shape substrate, or the like.

When divisional exposure is performed, regions overlapping each other are provided between the divided areas such that no unexposed region due to misalignment remains. In the example of FIG. 1, for example, a region in which a portion of the left exposure area 16L and a portion of the right exposure area 16R overlap each other is provided between the left exposure area 16L and the right exposure area 16R. This region is a double exposure area 18 that is exposed twice at the exposure of the left exposure area 16L and the exposure of the right exposure area 16R and corresponds to a connecting part of the left exposure area 16L and the right exposure area 16R. A center line 20 illustrated in FIG. 1 is a center line of the double exposure area 18 and is the boundary of the stitching exposure. In the photoelectric conversion device of the present embodiment, the double exposure area 18 is arranged along the Y direction so as to cross the pixel region 14 vertically.

FIG. 2 is a cross-sectional view of the pixel region 14 taken along the division direction (X direction) of the exposure area and corresponds to a cross-sectional view taken along the line A-A' of FIG. 1. Note that, while around several thousands of pixels are arranged in an actual pixel region 14, only ten pixels 22 (a pixel 22-1 to a pixel 22-10) near the center line 20 are illustrated in FIG. 2 to simplify the illustration.

As illustrated in FIG. 3, for example, each of the pixels 22 includes a photoelectric converter PD, a transfer transistor M1, a reset transistor M2, an amplifier transistor M3, and a select transistor M4. The photoelectric converter PD is a photodiode, for example, the anode thereof is connected to the ground node, and the cathode thereof is connected to the source of the transfer transistor M1. The drain of the transfer transistor M1 is connected to the source of the reset transistor M2 and the gate of the amplifier transistor M3. A connection node of the drain of the transfer transistor M1, the source of the reset transistor M2, and the gate of the amplifier transistor M3 is a so-called floating diffusion portion FD. The floating diffusion portion FD includes a capacitance component (floating diffusion capacitor Cfd) formed of a parasitic capacitance such as an interconnection capacitance, a junction capacitance, or the like and has a function as a charge holding portion. The drain of the reset transistor M2 and the drain of the amplifier transistor M3 are connected to the power supply node to which a voltage VDD is supplied. The source of the amplifier transistor M3 is connected to the drain of the select transistor M4. The source of the select transistor M4 is connected to an output line 24. The output line 24 is connected to a current source 26.

The photoelectric converter PD converts (photoelectrically converts) an incident light into charge corresponding to the light amount and accumulates the generated charge. When turned on, the transfer transistor M1 transfers charge held in the photoelectric converter PD to the floating diffusion portion FD. The floating diffusion portion FD has a voltage corresponding to the amount of charge transferred from the photoelectric converter PD by charge-to-voltage conversion in accordance with the capacitance. The amplifier transistor M3 has a configuration in which the voltage VDD is supplied to the drain and a bias current is supplied from the current source 26 to the source via the select transistor M4 and forms an amplifier unit (source follower circuit) having the gate as an input node. Thereby, the amplifier transistor M3 outputs a signal based on the voltage of the floating diffusion portion FD to the output line 24 via the select transistor M4. When turned on, the reset transistor M2 resets the floating diffusion portion FD to a voltage corresponding to the voltage VDD.

In FIG. 2, out of the components described above of each pixel 22, the photoelectric converter PD provided on a silicon substrate 30 and a metal layer 42 forming an interconnection, a signal line, a power supply line, or the like connected between the pixels 22 are illustrated. The metal layer 42 is arranged inside an insulating film 40 provided on the silicon substrate 30. An element isolation region 32 is provided between the photoelectric converters PD of adjacent pixels 22. While the element isolation region 32 may be formed of an insulating member having a LOCOS structure or an STI structure, the element isolation region 32 may be formed of only p-n junction isolation. Further, color filters 50 each having a predetermined transmission wavelength band in accordance with the pixel 22 and micro-lenses 60 that collect an incident light to the photoelectric converters PD are provided above respective pixels 22. Note that the color filters 50 are not necessarily required to be provided.

Here, pixels 22 belonging to two adjacent pixel columns interposing the double exposure area 18 are defined as a pixel group 1. Further, pixels 22 belonging to a plurality of pixel columns adjacent to one side of the pixel group 1 are defined as a pixel group 2. Further, pixels 22 belonging to a plurality of pixel columns adjacent to the pixel group 2 and on the side opposite to the pixel group 1 are defined as a pixel group 4. Further, pixels 22 belonging to a plurality of pixel columns adjacent to the other side of the pixel group 1 are defined as a pixel group 3. Further, pixels 22 belonging to a plurality of pixel columns adjacent to the pixel group 3 and on the side opposite to the pixel group 1 are defined as a pixel group 5.

Note that, while FIG. 2 illustrates the example in which each of the pixel group 2 to the pixel group 5 includes two pixel columns, the number of the pixel columns forming the pixel groups 2 to the pixel group 5 is not particularly limited as long as a width w described later can be sufficiently secured. The number of pixel columns forming the pixel group 2 and the number of the pixel columns forming the pixel group 3 may be the same or different from each other. Further, the number of pixel columns forming the pixel group 4 and the number of the pixel columns forming the pixel group 5 may be the same or different from each other.

In FIG. 2, the pixels 22-1 and 22-2 aligned in the division direction (X direction) of the exposure area are illustrated as the pixels 22 belonging to the pixel group 1. Further, pixels 22-3 and 22-5 aligned in the X direction are illustrated as the pixels 22 belonging to the pixel group 2. Further, pixels 22-4 and 22-6 aligned in the X direction are illustrated as the pixels 22 belonging to the pixel group 3. Further, pixels 22-7 and 22-9 aligned in the X direction are illustrated as the pixels 22 belonging to the pixel group 4. Further, pixels 22-8 and 22-10 aligned in the X direction are illustrated as the pixels 22 belonging to the pixel group 5.

The pixels 22 belonging to the pixel group 1 are arranged such that the arrangement pitch in the division direction (X direction) of the exposure area is an arrangement pitch pitch1. The pixels 22 belonging to the pixel group 2 and the pixel group 3 are arranged such that the arrangement pitch in the X direction is an arrangement pitch pitch2. The pixels 22 belonging to the pixel group 4 and the pixel group 5 are arranged such that the arrangement pitch in the X direction is an arrangement pitch pitch3.

In other words, the left exposure area 16L and the right exposure area 16R are a first region and a second region that are adjacent to each other in the X direction and in which pattern exposure of the same layer is performed by using different photomasks. The first region includes a third region that is in contact with the connecting part and a fourth region that is more distant from the connecting part than the third region. The second region includes a fifth region that is in contact with the connecting part and a sixth region that is more distant from the connecting part than the fifth region. The pixels 22-1 and 22-2 adjacent to each other in the X direction via the connecting part between the first region and the second region are arranged at the arrangement pitch pitch1. The pixels 22-4 and 22-6 adjacent to each other in the X direction in the third region and the pixels 22-3 and 22-5 adjacent to each other in the X direction in the fifth region are arranged at the arrangement pitch pitch2. The pixels 22-8 and 22-10 adjacent to each other in the X direction in the fourth region and the pixels 22-7 and 22-9 adjacent to each other in the X direction in the sixth region are arranged at the arrangement pitch pitch3.

Note that the arrangement pitch of the pixels 22 in a direction not dividing the exposure area (Y direction in the example of the present embodiment) is not particularly limited in the relation to the effect or advantage of the present invention and may be equal over the entire pixel region 14 or vary in accordance with the location.

Further, a width w1 in the X direction of the element isolation region 32 arranged between the photoelectric converters PD of the pixels 22-1 and 22-2 adjacent to each other in the X direction via the connecting part between the first region and the second region is larger than a width w2 in the X direction of the element isolation region 32 arranged between the photoelectric converters PD of the pixels 22-2 and 22-4 adjacent to each other in the X direction in the first region. Similarly, the width w1 in the X direction of the element isolation region 32 arranged between the photoelectric converters PD of the pixels 22-1 and 22-2 is larger than a width w3 in the X direction of the element isolation region 32 arranged between the photoelectric converters PD of the pixels 22-3 and 22-5 adjacent to each other in the X direction in the second region.

The micro-lenses 60 and the color filters 50 are arranged over the entire pixel region 14 so that an arrangement pitch in the X direction is a constant arrangement pitch pitch0. It can also be said that the average arrangement pitch of the micro-lenses 60 and the color filters 50 in the pixel region 14 is the arrangement pitch pitch0. It is desirable to arrange the micro-lenses 60 and the color filters 50 at a constant arrangement pitch so as not to disturb the spatial frequency of an object.

Note that the arrangement pitch is an alignment interval of aligned unit structures. With respect to the micro-lenses 60, the arrangement pitch can be defined as an interval between gaps between the micro-lenses 60 or an interval between the apexes of micro-lenses 60 adjacent to each other, for example. Further, with respect to the pixels 22, the arrangement pitch can be defined as an interval between the centers of widths z in the X direction of opening regions of the photoelectric converters PD defined by metal interconnections (the metal layer 42).

As described above, in the photoelectric conversion device according to the present embodiment, while the micro-lenses 60 and the color filters 50 are arranged at an equal arrangement pitch over the entire pixel region 14, the pixels 22 are arranged at different arrangement pitches in accordance with a location.

In the photoelectric conversion device of the present embodiment, the arrangement pitches pitch1, pitch2, and pitch3 of the pixels 22 have a relationship below.

pitch1>pitch3>pitch2

The arrangement pitch pitch0 of the micro-lenses 60 and the color filters 50 may be appropriately set in accordance with an optical positional relationship between the pixel region 14 and the imaging optical system (not illustrated), for example. In one example, the arrangement pitch pitch0 is wider than the arrangement pitch pitch2. Further, in one example, the arrangement pitch pitch0 is narrower than the arrangement pitch pitch1. That is, the arrangement pitches pitch1, pitch2, and pitch0 have a relationship below.

pitch1>pitch0>pitch2

For simplified illustration here, the arrangement pitch pitch0 of the micro-lenses 60 and the color filters 50 and the arrangement pitch pitch3 of the pixel 22 are the same. The relationship may be pitch1>pitch0>pitch3 or may be pitch2<pitch0<pitch3.

Note that, while the arrangement pitch in the X direction of the pixel 22 belonging to the pixel group 2 and the arrangement pitch in the X direction of the pixel 22 belonging to the pixel group 3 here are illustrated as the same arrangement pitch pitch2, these arrangement pitches are not necessarily required to be the same. Each of the arrangement pitch in the X direction of the pixel 22 belonging to the pixel group 2 and the arrangement pitch in the X direction of the pixel 22 belonging to the pixel group 3 may be any arrangement pitch as long as it has the same relationship as the arrangement pitch pitch2 with respect to the arrangement pitches pitch0, pitch1, and pitch3 described above.

Similarly, while the arrangement pitch in the X direction of the pixel 22 belonging to the pixel group 4 and the arrangement pitch in the X direction of the pixel 22 belonging to the pixel group 5 here are illustrated as the same arrangement pitch pitch3, these arrangement pitches are not necessarily required to be the same. Each of the arrangement pitch in the X direction of the pixel 22 belonging to the pixel group 4 and the arrangement pitch in the X direction of the pixel 22 belonging to the pixel group 5 may be any arrangement pitch as long as it has the same relationship as the arrangement pitch pitch3 with respect to the arrangement pitches pitch0, pitch1, and pitch2 described above.

The width z in the X direction of the opening region of the photoelectric converter PD is the same for all the pixels 22 forming the pixel region 14. This is for making the areas of the opening regions of the photoelectric converters PD be the same and suppressing the characteristic unevenness of the pixel 22 due to the difference in size of the opening region of the photoelectric converter PD. In the photoelectric conversion device according to the present embodiment, the arrangement pitches pitch1, pitch2, and pitch3 of the pixels 22 are adjusted by the spacing of the metal interconnections (the metal layer 42) of the pixels 22 adjacent to each other in the X direction.

That is, in the pixel group 4 and the pixel group 5, the spacing of the metal interconnections of the pixels 22 adjacent to each other in the X direction is set to a spacing s. In the pixel group 1, the spacing of the metal interconnections of the pixels 22 adjacent to each other in the X direction is set to a spacing s+w that is wider than the spacing s. In the pixel group 2 and the pixels group 3, the spacing of the metal interconnections of the pixels 22 adjacent to each other in the X direction is set to a spacing s' (=s−w/n) that is narrower than the spacing s. The spacing of the metal interconnections of the pixels 22 adjacent to each other in the X direction between the pixel group 2 and the pixel groups 1 and 4, and between the pixel group 3 and the pixel groups 1 and 5 are also the spacing s'. Note that the width w will be described later.

Here, n is the number of the pixels 22 aligned in the X direction in a region between the pixel group 4 and the pixel group 5. In other words, n is the number of the pixel columns arranged between the pixel group 4 and the pixel group 5. In the example of FIG. 2, n is six.

By adjusting the spacing of the metal interconnections of the pixels 22 adjacent to each other in the X direction in such a way, it is possible to set the arrangement pitches pitch1, pitch2, and pitch3 of the pixels 22 to the relationship described above while maintaining the constant width z in the X direction of the opening region of the photoelectric converter PD. By setting the arrangement pitches pitch1, pitch2, and pitch3 of the pixels 22 in such a way, the width in the X direction of the pixels 22 in the pixel group 1, the pixel group 2, and the pixel group 3 is represented as x−w/n, where the width in the X direction of the pixels 22 in the pixel group 4 and the pixel group 5 is denoted as x.

While the pixel group 2 and the pixel group 3 that minimize the arrangement pitch of the pixels 22 are formed of two pixel columns, respectively, for simplicity in FIG. 2, the number of pixel columns forming the pixel group 2 and the pixel group 3 may be further increased. With such a configuration, the width w used for increasing a space between the metal layers 42 in the double exposure area 18 can be more easily secured.

The metal interconnection that defines the width z in the X direction of the opening region of the photoelectric converter PD and the spacings s, s', or s+w of the pixels 22 adjacent to each other in the X direction may be the output line 24 formed of the metal layer 42 or the power supply line (a VDD line or a GND line) that supplies a predetermined power supply voltage.

Next, the reason for increasing the spacing of the metal interconnections of the pixels 22 adjacent to each other via the double exposure area 18 will be described with reference to FIG. 4. FIG. 4 is a schematic diagram illustrating an example of a photomask (also referred to as a reticle) used in a photolithography process when the metal layer 42 is formed and a pattern formed on the semiconductor substrate. While a lens is arranged between the semiconductor substrate and a photomask to reduce the pattern on the photomask in size and project the reduced pattern on the semiconductor substrate at the time of actual pattern exposure, a pattern on the photomask and a pattern on the semiconductor substrate here are illustrated in the same size to simplify the illustration.

To clearly indicate the problem, FIG. 4 illustrates, as a reference example, a case where the pixels 22 are aligned at an equal pitch such that the spacing between the metal interconnections of the adjacent pixels 22 is the same. That is, a pattern on the photomask is designed such that the spacing between the metal interconnections of the adjacent pixels 22 is spacing s in the entire area including the double exposure area 18.

A positive type photoresist (not illustrated) is used for patterning of the metal layer 42, for example. A photoresist film is exposed and developed through a photomask on which a predetermined pattern formed of a light-shielding member such as chrome is drawn, an unexposed portion of the photoresist selectively remains, and thereby the pattern on the photomask is transferred to the photoresist film. By etching the base metal layer by using the photoresist film patterned in such a way as a mask, it is possible to form the metal layer 42 having a predetermined pattern.

As illustrated in FIG. 4, a photomask 70L used for exposing the left exposure area 16L and a photomask 70R used for exposing the right exposure area 16R are used to expose the pattern of the metal layer 42. The photomask 70L includes an interconnection pattern 72L corresponding to a metal interconnection arranged on the left exposure area 16L and a light-shielding pattern 74L that defines the end of the left exposure area 16L on the right exposure area 16R side. Similarly, the photomask 70R includes an interconnection pattern 72R corresponding to a metal interconnection arranged on the right exposure area 16R and a light-shielding pattern 74R that defines the end of the right exposure area 16R on the left exposure area 16L side. A region between the end of the light-shielding pattern 74L on the left exposure area 16L side and the end of the light-shielding pattern 74R on the right exposure area 16R side is the double exposure area 18.

FIG. 4 illustrates two types of mask sets, that is, a mask set 1 and a mask set 2 in which the patterns of the double exposure area 18 are different. In the mask set 1 and the mask set 2, while the interconnection patterns 72L and the interconnection patterns 72R are the same, the light-shielding patterns 74L and light-shielding patterns 74R are different.

That is, in the mask set 1, the end of the light-shielding pattern 74L of the photomask 70L on the left exposure area 16L side is designed so as to be matched to the end of the left exposure area 16L side of the interconnection pattern 72R of the photomask 70R. Further, in the mask set 1, the end of the light-shielding pattern 74R of the photomask 70R on the right exposure area 16R side is designed so as to be matched to the end of the interconnection pattern 72L of the photomask 70L on the right exposure area 16R side.

On the other hand, in the mask set 2, the end of the light-shielding pattern 74L of the photomask 70L on the left exposure area 16L side is designed so as to be closer to the left exposure area 16L side than the end of the of the interconnection pattern 72R of the photomask 70R on the left exposure area 16L side. Further, in the mask set 2, the end of the light-shielding pattern 74R of the photomask 70R on the right exposure area 16R side is designed so as to be closer to the right exposure area 16R side than the end of the interconnection pattern 72L of the photomask 70L on the right exposure area 16R side.

First, the problem when the mask set 1 is used will be described. It is assumed here that the left exposure area 16L is exposed by using the photomask 70L of the mask set 1, and then the right exposure area 16R is exposed by using the photomask 70R of the mask set 1.

By performing exposure of the left exposure area 16L by using the photomask 70L, a latent image in accordance with a pattern of the photomask 70L is formed on the photoresist film provided in the left exposure area 16L. At this time, in the right exposure area 16R, since no light transmits through a region on the right side of the end of the light-shielding pattern 74L on the left exposure area 16L side, the photoresist film in such a region is not exposed.

Next, by performing exposure of the right exposure area 16R by using the photomask 70R, a latent image in accordance with a pattern of the photomask 70R is formed on the photoresist film provided in the right exposure area 16R. At this time, in the left exposure area 16L, since no light transmits through a region located on the left side of the end of the light-shielding pattern 74R on the right exposure area 16R side, the photoresist film in such a region is not exposed.

At this time, when there is no misalignment between the photomask 70L and the photomask 70R, neither a region overlapping the interconnection pattern 72R is exposed when the left exposure area 16L is exposed nor a region overlapping the interconnection pattern 72L is exposed when the right exposure area 16R is exposed. Therefore, it is possible to form the metal interconnections 42L and 42R having sizes in accordance with patterns formed on the photomask 70L and the photomask 70R.

When there is a misalignment between the photomask 70L and the photomask 70R, however, a region used for forming the interconnection pattern 72R may be exposed when the left exposure area 16L is exposed, or a region used for forming the interconnection pattern 72L may be exposed when the right exposure area 16R is exposed. That is, when the photomask 70R is shifted to the left side compared to the state of FIG. 4, at least a part of the region corresponding to the interconnection pattern 72L is not covered by the light-shielding pattern 74R. Further, at least a part of the region corresponding to the interconnection pattern 72R is not covered by the light-shielding pattern 74L. Accordingly, the interconnection widths of the metal interconnections 42L and 42R become narrower than the size in accordance with the patterns formed on the photomask 70L and the photomask 70R.

As a result, the interconnection widths of the metal interconnections 42L and 42R of the adjacent pixels 22-1 and 22-2 interposing the double exposure area 18 become narrower than the interconnection widths of metal interconnections in other areas, and an increase in the interconnection resistance or in-plane unevenness of the interconnection capacitance occurs, which may cause unevenness of pixel characteristics.

To reduce unevenness of a pattern of a metal interconnection, it is conceivable to employ a pattern such as the mask set 2. As described above, the mask set 2 is designed such that the end of the light-shielding pattern 74L of the photomask 70L on the left exposure area 16L side is located on the left exposure area 16L side of the end of the interconnection pattern 72R of the photomask 70R on the left exposure area 16L side. Further, the end of the light-shielding pattern 74R of the photomask 70R on the right exposure area 16R side is designed so as to be located on the right exposure area 16R side of the end of the interconnection pattern 72L of the photomask 70L on the right exposure area 16R side. Therefore, even when a misalignment between the photomask 70L and the photomask 70R occurs, the interconnection widths of the metal interconnections 42L and 42R are not reduced when the misalignment amount is lower than or equal to the shifted amount between the end of the interconnection pattern 72 and the end of the light-shielding pattern 74.

However, when the spacing between the interconnection pattern 72L and the light-shielding pattern 74L and the spacing between the interconnection pattern 72R and the light-shielding pattern 74R are too close, the spacing between the patterns in not secured, and thereby the metal interconnection 42L and the metal interconnection 42R may be short-circuited. Further, when the photomask 70R is more shifted to the right side compared to the state of FIG. 4, the light-shielding pattern 74L and the light-shielding pattern 74R are connected in plan view, and therefore the metal interconnection 42L and the metal interconnection 42R may be short-circuited.

Accordingly, in the present embodiment, the patterns on the photomasks 70L and 70R are designed such that the spacing between the metal interconnection 42R and the metal interconnection 42L of the two adjacent pixels 22-1 and 22-2 interposing the double exposure area 18 is s+w. Specifically, as illustrated in FIG. 5, the spacing between the interconnection pattern 72L and the interconnection pattern 72R in plan view is set to s+w in the design of the mask set 2 described above. With such a configuration, the spacing between the interconnection pattern 72L and the light-shielding pattern 74L and the spacing between the interconnection pattern 72R and the light-shielding pattern 74R can be increased. Therefore, even when a misalignment occurs between the photomask 70L and the photomask 70R, changes of the interconnection widths of the metal interconnections 42L and 42R can be suppressed and, in addition, a short-circuit between the metal interconnection 42L and the metal interconnection 42R can also be prevented.

In the present embodiment, as with the mask set 2, the light-shielding patterns 74L and 74R are designed such that the interconnection widths of the metal interconnections 42L and 42R are not reduced even when the maximum tolerable misalignment occurs between the photomask 70L and the photomask 70R. That is, the light-shielding patterns 74L and 74R are designed such that the light-shielding pattern 74L and the interconnection pattern 72R are overlapped with each other and the light-shielding pattern 74R and the interconnection pattern 72L are overlapped with each other even when the maximum tolerable misalignment occurs between the photomask 70L and the photomask 70R. In addition, the width w may be appropriately set such that a spacing larger than or equal to the minimum processing dimension can be secured for the spacing between the light-shielding pattern 74L and the light-shielding pattern 74R even when the maximum tolerable misalignment between the photomask 70L and the photomask 70R occurs.

It is also possible to increase the spacing between the adjacent metal interconnection 42R and the metal interconnection 42L interposing the double exposure area 18 by adjusting a width z of the opening of the photoelectric converter PD in the pixel 22 of the pixel group 1. In such a case, however, the width z of the opening of the photoelectric converter PD in the pixel 22 of the pixel group 1 is required to be significantly reduced, and thereby evenness between the characteristics of the pixels belonging to the pixel group 1 and the characteristics of the pixels 22 belonging to other pixel groups is impaired.

Accordingly, in the present embodiment, the arrangement pitches of the pixels 22 in the pixel group 2 and the pixel group 3 are reduced, and the reduced part is used to increase the arrangement pitch of the pixels 22 in the pixel group 1. With such a configuration, it is possible to prevent changes of the interconnection widths of the metal interconnections 42L and 42R or a short-circuit between the metal interconnection 42L and the metal interconnection 42R while suppressing unevenness of the characteristics of the pixels 22.

When the arrangement pitch pitch2 of the pixels 22 in the pixel group 2 and the pixel group 3 is reduced, it is preferable to reduce the spacing s' between the metal interconnections of the adjacent pixels 22 rather than to reduce the width z of the opening of the photoelectric converter PD. This is because the above is preferable for suppressing unevenness of the characteristics of the pixels 22 as with the case of the pixels 22 in the pixel group 1.

With a larger number of the pixels 22 forming the pixel group 2 and the pixel group 3, it is possible to more easily widen the spacing between the metal interconnection 42R and the metal interconnection 42L adjacent to each other and interposing the double exposure area 18. Further, with a larger the number of the pixels 22 forming the pixel group 2 and the pixel group 3, it is possible to reduce the amount of the interposed arrangement pitch per pixel, and thereby evenness of the pixel characteristics is improved. Note that it is desirable to determine a region in which the pixel group 1, the pixel group 2, and the pixel group 3 are arranged taking the incidence angle of a light to the pixel region 14 into consideration.

FIG. 6 is a graph illustrating output of the pixel when light enters the photoelectric conversion device 100 via an image capture lens having a pupil distance of 35 mm and an F value of 10. The horizontal axis indicates the position (pixel coordinates) of the pixel 22 in the X direction, and the vertical axis indicates the relative value of the pixel output (sensitivity).

As illustrated in FIG. 6, the output of the pixel 22 arranged in a region of around 10% near the center of the pixel region 14 does not significantly change and is substantially constant. This indicates that a light enters the pixel 22 substantially perpendicularly near the center of the pixel region 14 and the metal layer 42 does not prevent the light from entering the pixel 22.

As described above, since a light that passes through an image capture lens of a camera or a scale-down optical system of a copying machine substantially perpendicularly enters an element face near the center of the pixel region 14, the pixel characteristics are less affected even when the arrangement pitch of the pixel 22 is irregular. It is therefore desirable that the pixel group 1, the pixel group 2, and the pixel group 3 whose arrangement pitches are changed be arranged near the center of the pixel region 14. Tt is desirable as a rough criterion that the pixel group 1, the pixel group 2, and the pixel group 3 be located in the center of the pixel region 14 in the division direction (X direction) and arranged in an area that occupies the area of around 10% or less of the pixel region 14.

As described above, according to the present embodiment, it is possible to secure an alignment margin in divisional exposure without impairing evenness of pixel characteristics and stably manufacture a photoelectric conversion device that may acquire a high quality image.

Second Embodiment

A photoelectric conversion device and a method of manufacturing the same according to a second embodiment of the present invention will be described with reference to FIG. 7. The same components as those of the photoelectric conversion device according to the first embodiment will be labeled with the same references, and the description thereof will be omitted or simplified.

Although the pixels 22 are aligned at three types of pitches in the first embodiment, the number of types of arrangement pitches of the pixels 22 is not necessarily required to be three. In the present embodiment, an example in which the pixels 22 are aligned at two types of arrangement pitches will be described.

Figure 7:
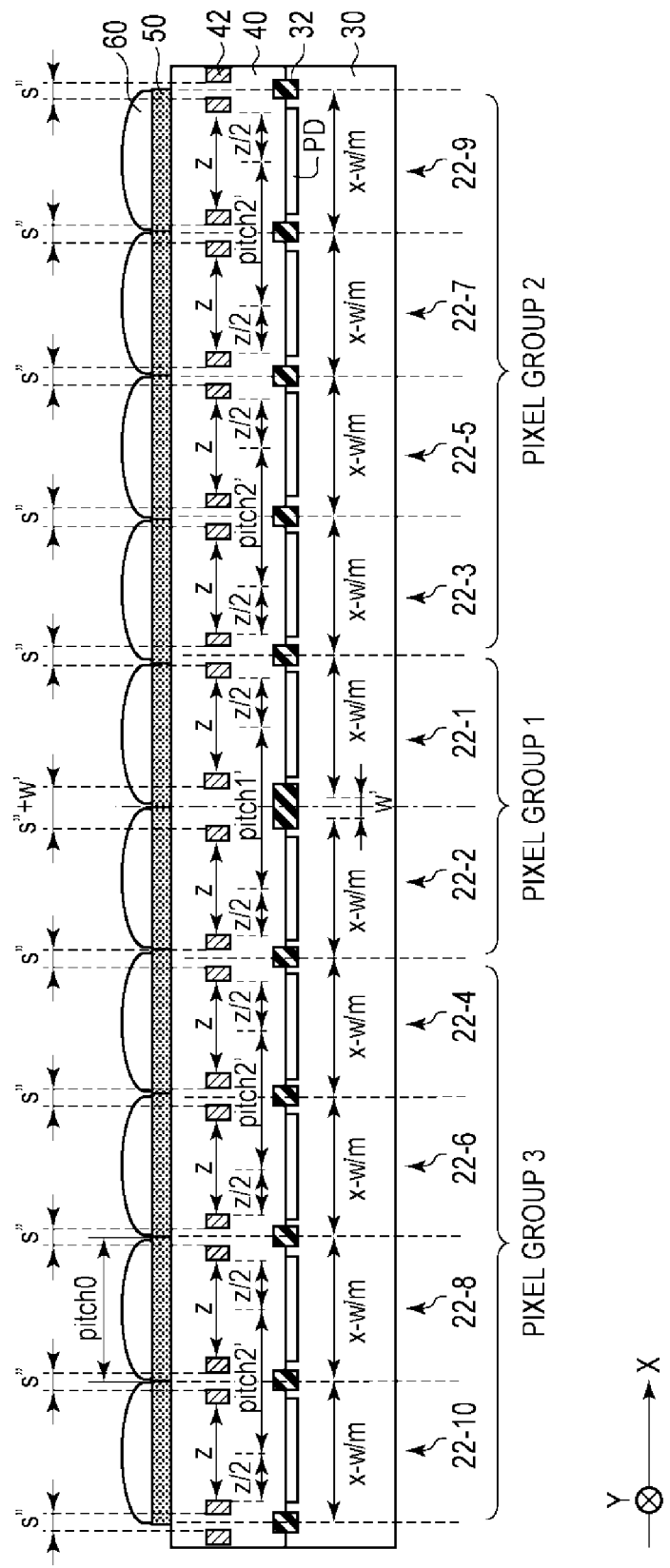
FIG. 7 is a schematic cross-sectional view of a photoelectric conversion device according to a second embodiment of the present invention.

FIG. 7 is a cross-sectional view illustrating a configuration example of the photoelectric conversion device according to the present embodiment. In the present embodiment, as illustrated in FIG. 7, the pixels 22 belonging to two adjacent pixel columns interposing the double exposure area 18 are defined as the pixel group 1. Further, the pixels 22 belonging to a plurality of pixel columns that are adjacent on one side of the pixel group 1 are defined as the pixel group 2. Further, the pixels 22 belonging to a plurality of pixel columns that are adjacent on the other side of the pixel group 1 are defined as the pixel group 3.

When the number of pixel columns forming the pixel region 14 is m, the number of pixel columns forming the pixel group 1 is 2, and the sum of the number of pixel columns forming the pixel group 2 and the number of pixel columns forming the pixel group 3 is m−2. The number of pixel columns forming the pixel group 2 and the number of pixel columns forming the pixel group 3 may be the same or may be different.

FIG. 7 illustrates pixels 22-1 and 22-2 aligned in the division direction of the exposure area (X-direction) as the pixels 22 belonging to the pixel group 1. Further, pixels 22-3, 22-5, 22-7, and 22-9 aligned in the X-direction are illustrated as some of the pixels 22 belonging to the pixel group 2. Further, pixels 22-4, 22-6, 22-8, and 22-10 aligned in the X-direction are illustrated as some of the pixels 22 belonging to the pixel group 3.

The pixels 22 belonging to the pixel group 1 are arranged so that the arrangement pitch along the division direction of the exposure area (X-direction) is an arrangement pitch pitch1'. The pixels 22 belonging to the pixel group 2 and the pixel group 3 are arranged so that the arrangement pitch along the X-direction is an arrangement pitch pitch2'. Here, the arrangement pitches pitch1' and pitch2' of the pixels 22 have the relationship below.

$$pitch1' > pitch2'$$

On the other hand, the micro-lenses 60 and the color filters 50 are arranged so that the arrangement pitch along the X-direction is a constant arrangement pitch pitch0 over the entire pixel region 14.

The arrangement pitch pitch0 of the micro-lenses 60 and the color filters 50 may be suitably set in accordance with an optical positional relationship between the pixel region 14 and an imaging optical system (not illustrated), for example. In one example, the arrangement pitch pitch0 is wider than the arrangement pitch pitch2' and narrower than the arrangement pitch pitch1'. To simplify the illustration here, the arrangement pitch pitch0 of the micro-lenses 60 and the color filters 50 is the same as the arrangement pitch pitch3 of the pixels 22 illustrated in the first embodiment.

In the pixel group 2 and the pixel group 3, the spacing between metal interconnections of the pixels 22 that are adjacent in the X-direction is set to a spacing s" (=s−w'/m) that is narrower than the spacing s illustrated in the first embodiment. In the pixel group 1, the spacing between metal interconnections of the pixels 22 that are adjacent in the X-direction is set to a spacing s"+w' that is wider than s".

The spacing between metal interconnections of the pixels 22 that are adjacent in the X-direction between the pixel group 2 and the pixel group 1 and between the pixel group 3 and the pixel group 1 is a spacing s''.

When the arrangement pitch of the pixels 22 is changed, it is desirable to selectively change the arrangement pitch of the pixels 22 arranged near the center of the pixel region 14, as illustrated in the first embodiment. However, when a large number of pixels 22 are arranged in a region ranging from a part near the center to the end of the pixel region 14, it is possible to reduce the reduction amount of the arrangement pitch per pixel by reducing the arrangement pitch of the pixels 22 over the entire pixel region 14 except the double exposure area 18. That is, since the spacing s'' is represented by s−w'/m, as described above, the spacing s'' can be closer to the spacing s as the number m of the pixel columns is increased.

Therefore, also by configuring the photoelectric conversion device in such a way, it is possible to suppress incidence of a light from being obstructed by the metal layer 42 and suppress the pixel characteristics from being uneven due to a narrower arrangement pitch of the pixels 22.

As described above, according to the present embodiment, it is possible to secure an alignment margin in divisional exposure without impairing evenness of pixel characteristics and stably manufacture a photoelectric conversion device that may acquire a high quality image.

Third Embodiment

Figure 8:
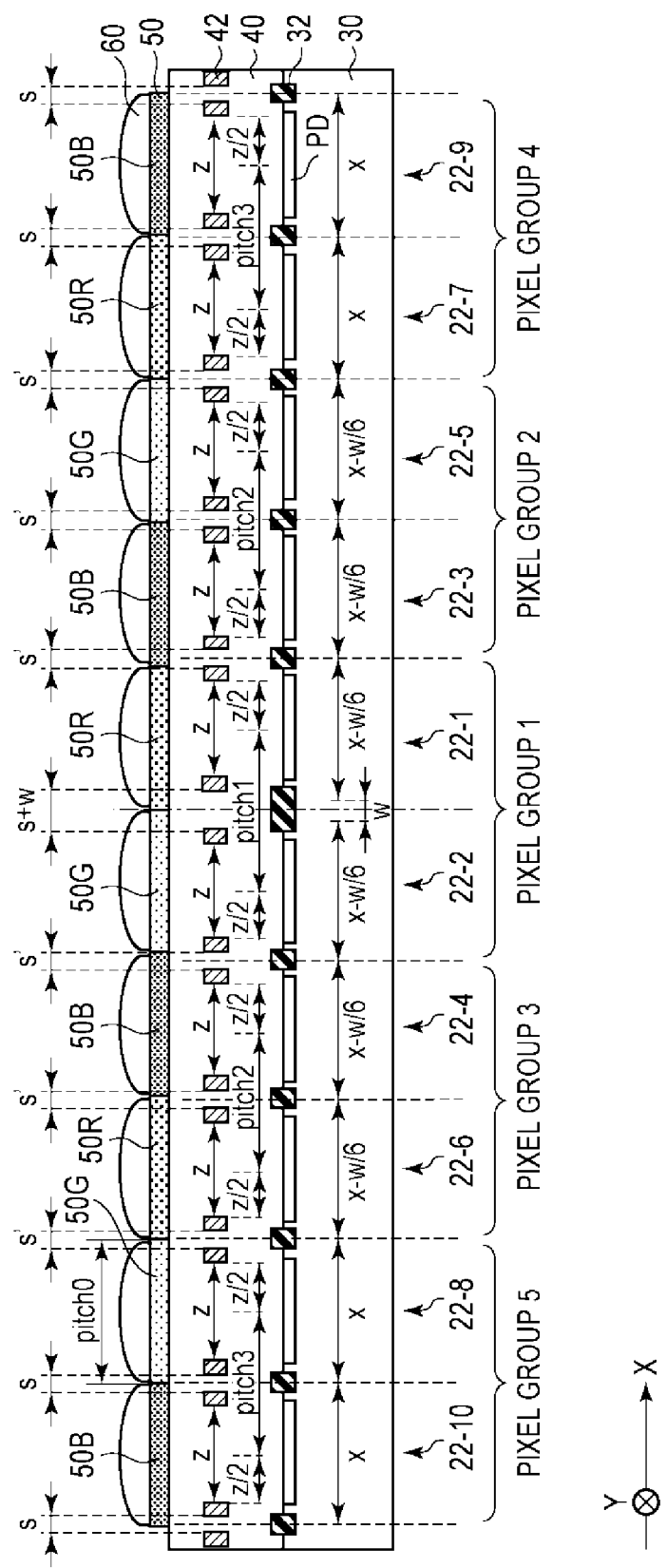
FIG. 8, FIG. 9, and FIG. 10 are schematic cross-sectional views of a photoelectric conversion device according to a third embodiment of the present invention.
Figure 9:
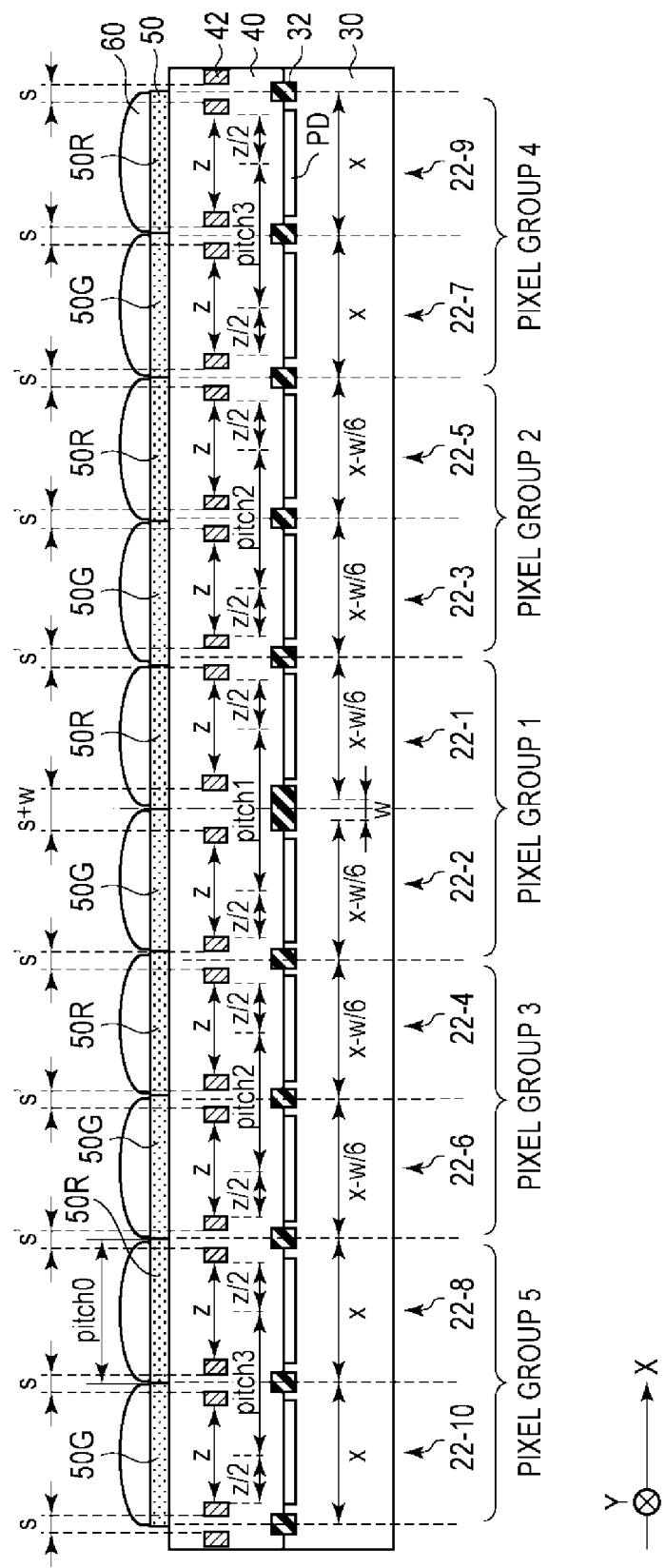
Figure 10:
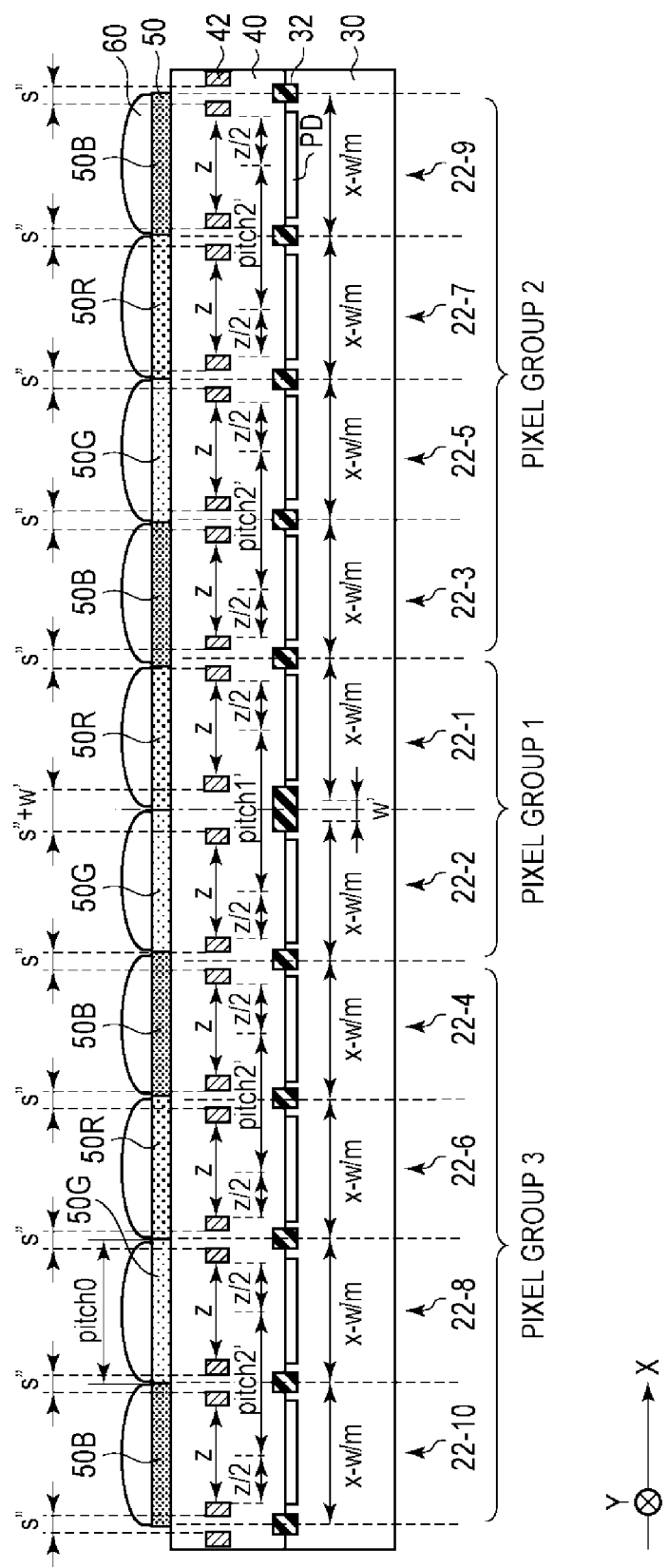

A photoelectric conversion device and a method of manufacturing the same according to a third embodiment of the present invention will be described with reference to FIG. 8 to FIG. 10. The same components as those of the photoelectric conversion device according to the first and second embodiments will be labeled with the same references, and the description thereof will be omitted or simplified. FIG. 8 to FIG. 10 are cross-sectional views illustrating a configuration example of the photoelectric conversion device according to the present embodiment.

The photoelectric conversion device according to the present embodiment is the same as the photoelectric conversion device according to the first or second embodiment except for a difference in the configuration of the color filter 50.

That is, the photoelectric conversion device illustrated in FIG. 8 has arrangement in which the blue color filter 50B, the green color filter 50G, and the red color filter 50R are repeatedly arranged in this order along the X-direction (row direction) in the photoelectric conversion device of the first embodiment illustrated in FIG. 2. In such arrangement, the blue color filter 50B, the green color filter 50G, and the red color filter 50R can be repeatedly arranged in this order also in the Y-direction (column direction) (not illustrated). In such a case, color filters of three pixels arranged in the X-direction and the Y-direction have different transmission wavelength bands from each other.

Further, the photoelectric conversion device illustrated in FIG. 9 has arrangement in which a Bayer arrangement color filter array is formed of the blue color filter 50B, the green color filter 50G, and the red color filter 50R in the photoelectric conversion device of the first embodiment illustrated in FIG. 2. In the cross section illustrated in FIG. 9, a pixel row in which the green color filter 50G and the red color filter 50R are repeatedly arranged in this order in the X-direction (row direction) is illustrated. Although not depicted, in a pixel row adjacent to the pixel row illustrated in FIG. 9, the green color filter 50G, and the blue color filter 50B are repeatedly arranged in this order.

Further, the photoelectric conversion device illustrated in FIG. 10 has arrangement in which the blue color filter 50B, the green color filter 50G, and the red color filter 50R are repeatedly arranged in this order in the X-direction (row direction) in the photoelectric conversion device of the second embodiment illustrated in FIG. 7. Note that the same Bayer arrangement color filter array as that in FIG. 9 may be formed in the photoelectric conversion device of the second embodiment illustrated in FIG. 7.

When the color filters 50 having different transmission wavelength bands are arranged for the adjacent pixels 22 as with the photoelectric conversion devices illustrated in FIG. 8 to FIG. 10, scattering of an incident light by the metal layer 42 may cause color mixture. For example, when a light that has entered the pixel 22-2 of FIG. 8 via the corresponding green color filter 50G is scattered by the metal layer 42 and enters the right adjacent pixel 22-1, color mixture of green and red may occur at the pixel 22-1. Further, when a light that has entered the pixel 22-2 of FIG. 8 via the corresponding green color filter 50G is scattered by the metal layer 42 and enters the left adjacent pixel 22-4, color mixture of green and blue may occur at the pixel 22-4.

As described in the first embodiment, however, the light that has passed through a coupling lens of a camera or a scale-down optical system of a copying machine enters the plane of an imaging element substantially perpendicularly near the center of the pixel region 14. Therefore, even if the arrangement pitches of the adjacent pixels 22 are irregular in the pixel group 1, the pixel group 2, and the pixel group 3 arranged near the center of the pixel region 14, a light is neither obstructed by the metal layer 42 before incidence nor scattered by the metal layer 42. Further, a difference in the arrangement pitch depending on the location does not cause a change in influence of color mixture inside the plane. Therefore, even when applied to a photoelectric conversion device having multiple types of color filters having different transmission wavelength bands, the photoelectric conversion device according to the first embodiment can acquire a high quality image without color mixture.

Further, in the photoelectric conversion device according to the second embodiment, by reducing the arrangement pitch of the pixels 22 over the entire pixel region 14 except the double exposure area 18, the reduction amount of the arrangement pitch per pixel is reduced. Accordingly, when the arrangement pitch of the pixels 22 that are adjacent via the double exposure area 18 is increased, it is possible to suppress influence on the arrangement pitch between other pixels 22 and prevent a light from being obstructed by the metal layer 42 before incidence or scattered by the metal layer 42. Further, a difference in the arrangement pitch depending on the location does not cause a change in influence of color mixture inside the plane. Therefore, even when applied to a photoelectric conversion device having multiple types of color filters having different transmission wavelength bands, the photoelectric conversion device according to the second embodiment can acquire a high quality image without color mixture.

As discussed above, according to the present embodiment, it is possible to secure an alignment margin in divisional exposure without impairing evenness of pixel characteristics and stably manufacture a photoelectric conversion device that may acquire a high quality image.

Fourth Embodiment

Figure 11:
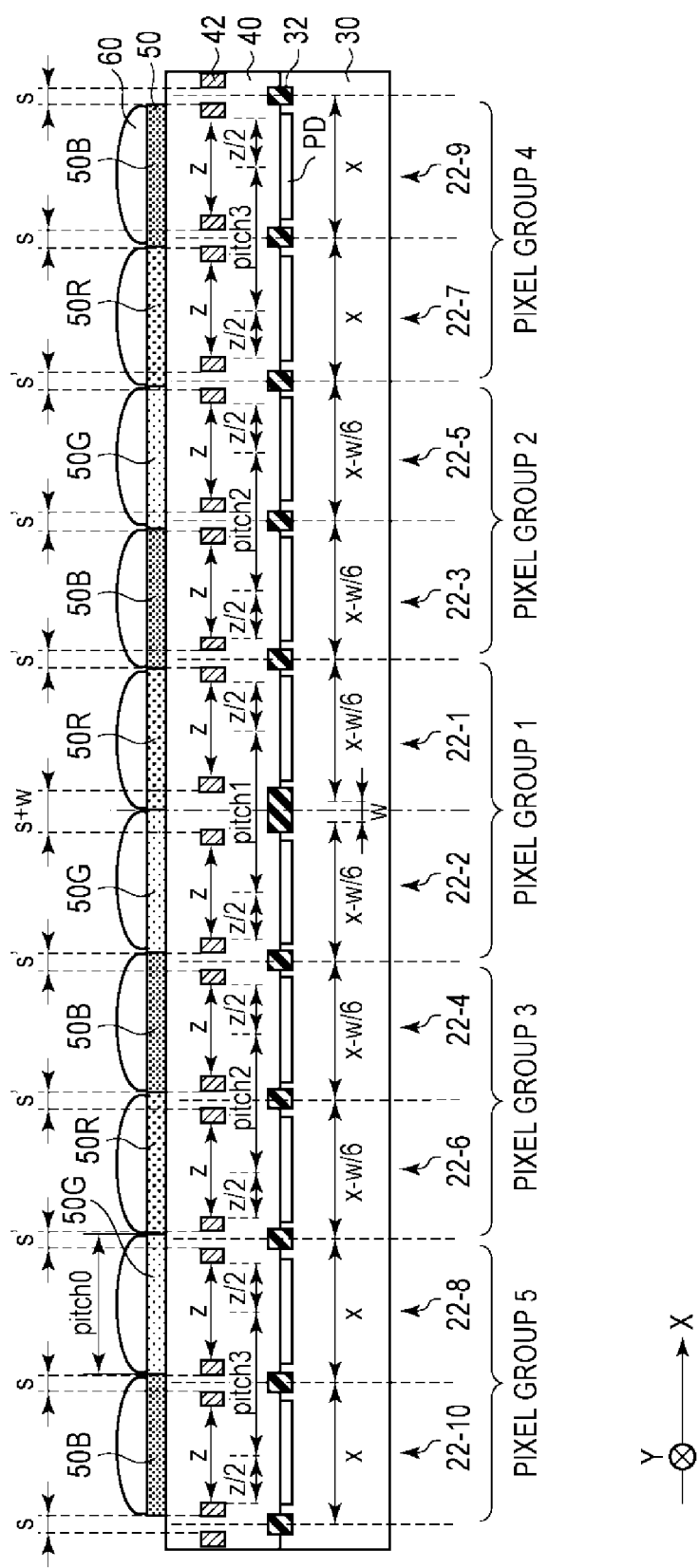
FIG. 11 and FIG. 12 are schematic cross-sectional views of a photoelectric conversion device according to a fourth embodiment of the present invention.
Figure 12:
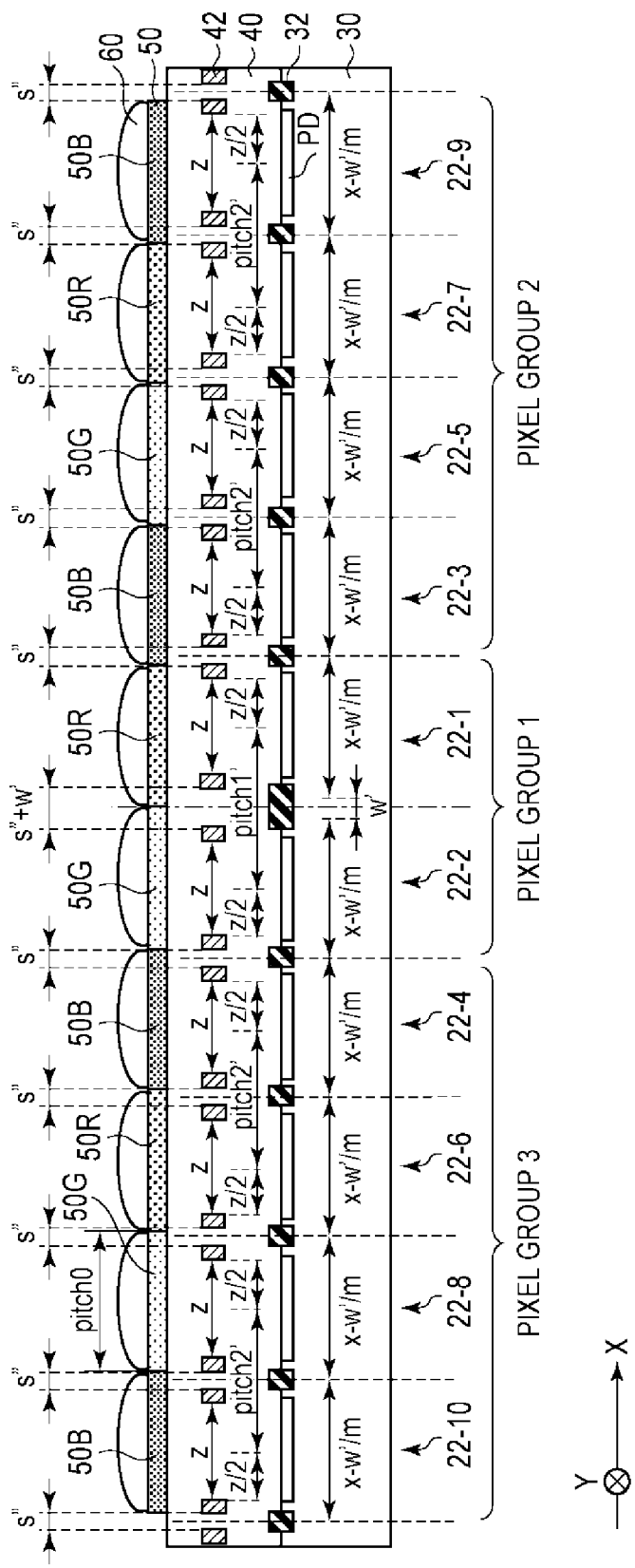
Figure 13:
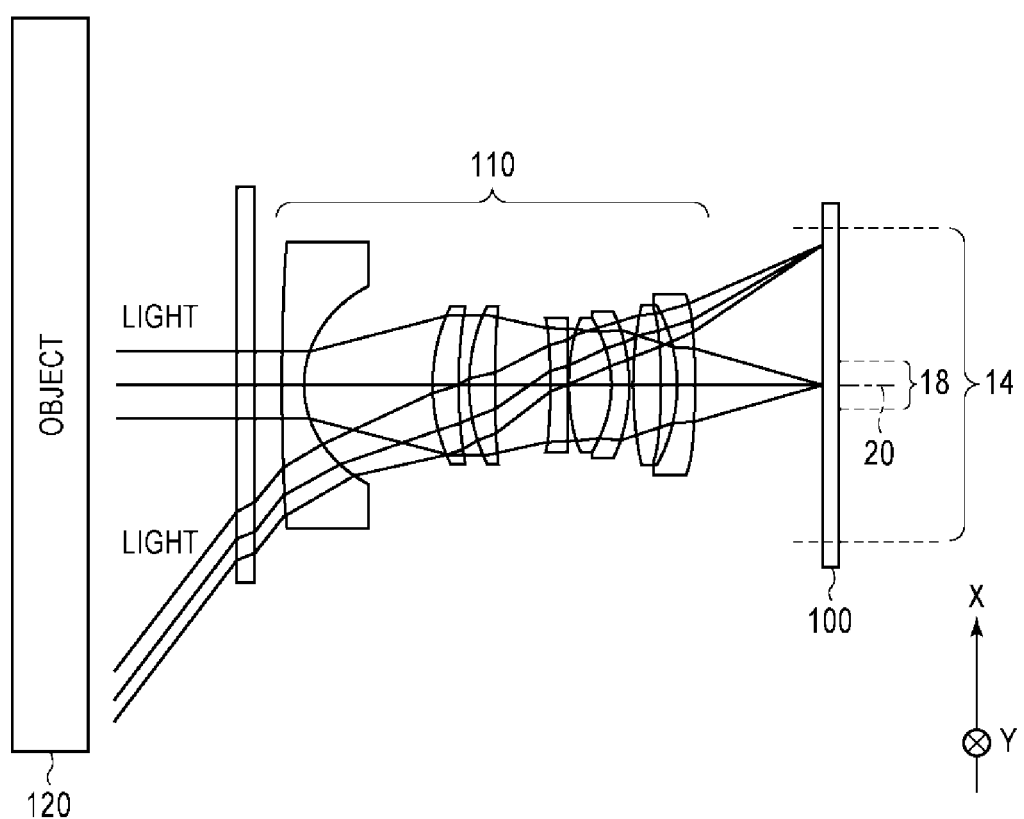
FIG. 13 is a schematic diagram illustrating one example of an incidence optical system formed for a photoelectric conversion device.

A photoelectric conversion device and a method of manufacturing the same according to a fourth embodiment of the present invention will be described with reference to FIG. 11 to FIG. 13. The same components as those of the photoelectric conversion device according to the first to third embodiments will be labeled with the same references, and the description thereof will be omitted or simplified. FIG. 11 and FIG. 12 are cross-sectional views illustrating configuration examples of the photoelectric conversion device according to the present embodiment. FIG. 13 is a schematic diagram illustrating one example of an incident optical system configured for the photoelectric conversion device.

The photoelectric conversion device according to the present embodiment is different from the photoelectric conversion device according to the third embodiment illustrated in FIG. 9 and FIG. 10 in that the arrangement pitch pitch0 of the micro-lenses 60 and the color filters 50 is smaller than the average arrangement pitch of the pixels 22 in the entire pixel region 14. That is, in the photoelectric conversion device according to the present embodiment, the sizes of the micro-lens array and the color filter array in plan view are reduced at a magnification less than 1 with respect to the pixel region 14.

FIG. 11 is a photoelectric conversion device in which the configuration of the present embodiment is applied to the photoelectric conversion device according to the third embodiment illustrated in FIG. 9. In the photoelectric conversion device according to the third embodiment illustrated in FIG. 9, the average arrangement pitch of the pixels 22 in the entire pixel region 14 is equal to the arrangement pitch pitch3 in the pixel group 4 and the pixel group 5. That is, in the photoelectric conversion device according to the present embodiment illustrated in FIG. 11, the arrangement pitches pitch0, pitch1, pitch2, and pitch3 have a relationship below.

pitch1>pitch3>pitch2 pitch3>pitch0

FIG. 12 is a photoelectric conversion device in which the configuration of the present embodiment is applied to the photoelectric conversion device according to the third embodiment illustrated in FIG. 10. In the photoelectric conversion device according to the third embodiment illustrated in FIG. 10, the average arrangement pitch of the pixels 22 in the entire pixel region 14 is substantially equal to the arrangement pitch pitch2' in the pixel group 2 and the pixel group 3. That is, in the photoelectric conversion device according to the present embodiment illustrated in FIG. 12, the arrangement pitches pitch0, pitch1', and pitch2' have a relationship below.

pitch1'>pitch2'>pitch0

FIG. 13 is a schematic diagram illustrating one example of an incident optical system configured for the photoelectric conversion device 100. An image forming lens 110 is an optical system forming a coupling lens of a camera or a scale-down optical system of a copying machine, for example. A light reflected by an object 120 enters the pixel region 14 of the photoelectric conversion device 100 via the image forming lens 110. At this time, as illustrated in FIG. 13, with respect to the light that has passed through the image forming lens 110, a light entering a part closer to the end of the pixel region 14 has a larger inclination angle relative to the normal direction of the pixel region 14 of the photoelectric conversion device 100. Thus, by reducing the size in plan view of the micro-lens array and the color filter array at a magnification less than 1 with respect to the pixel region 14, it is possible to effectively guide a light to the photoelectric converter PD in particular in the pixel 22 at the end of the pixel region 14.

Therefore, according to the configuration of the photoelectric conversion device according to the present embodiment, it is possible to suppress a light from being obstructed by the metal layer 42 before incidence or scatted by the metal layer 42 even in the pixel 22 at the end of the pixel region 14, and it is thus possible to acquire a higher quality image.

As discussed above, according to the present embodiment, it is possible to secure an alignment margin in divisional exposure without impairing evenness of pixel characteristics and stably manufacture a photoelectric conversion device that may acquire a high quality image.

Fifth Embodiment

Figure 14:
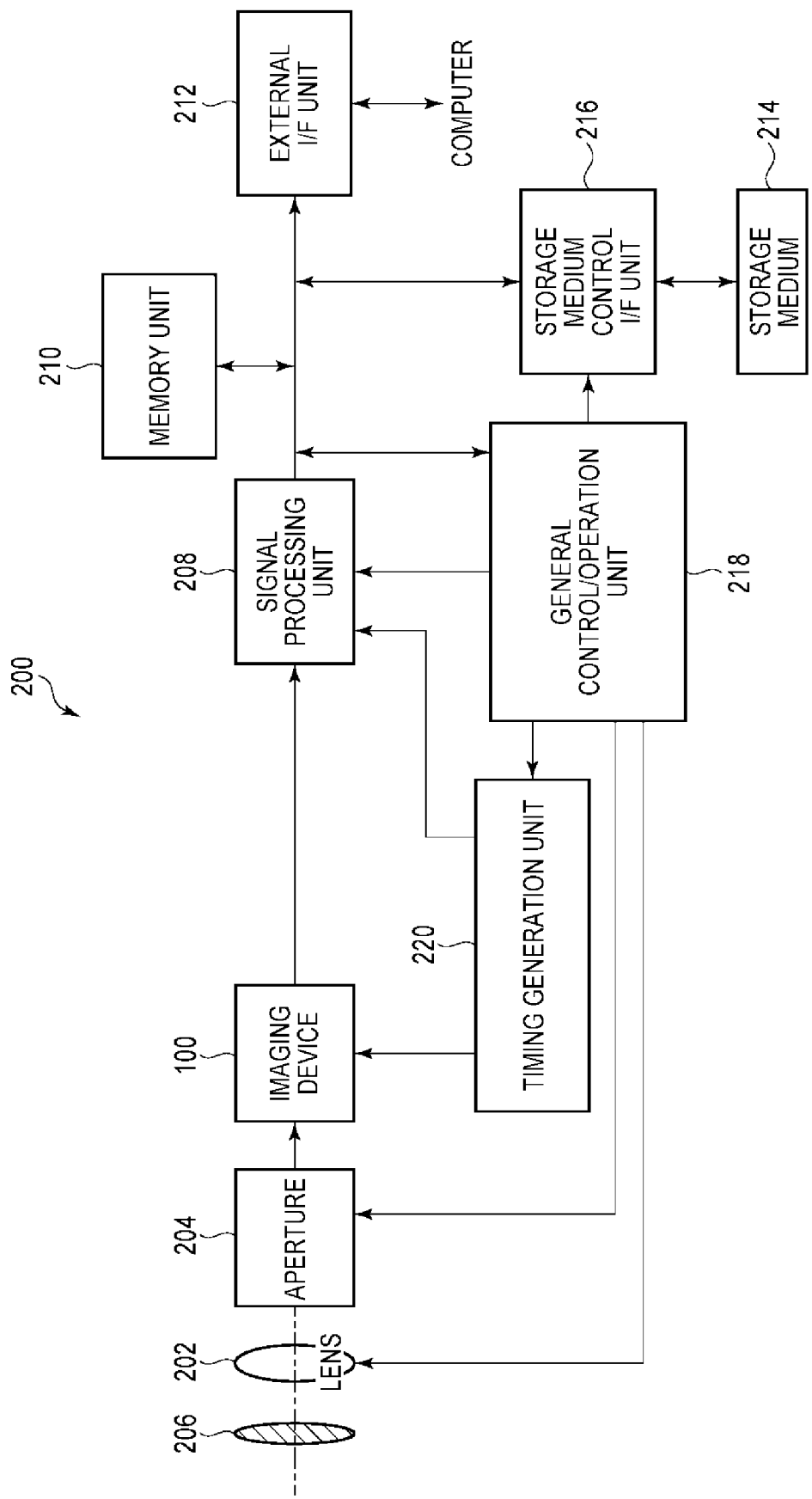
FIG. 14 is a block diagram illustrating a general configuration of an imaging system according to a fifth embodiment of the present invention.

An imaging system according to a fifth embodiment of the present invention will be described with reference to FIG. 14. FIG. 14 is a block diagram illustrating a general configuration of the imaging system according to the present embodiment.

The photoelectric conversion devices 100 described in the above first to fourth embodiments are applicable to various imaging systems. An example of applicable imaging systems may be a digital still camera, a digital camcorder, a surveillance camera, a copying machine or a fax machine, an image reading apparatus such as a scanner, a mobile phone, an on-vehicle camera, an observation satellite, or the like. Further, a camera module including an optical system such as a lens and an imaging device is also included in the imaging system. FIG. 14 illustrates a block diagram of a digital still camera as an example thereof.

An imaging system 200 illustrated as an example in FIG. 14 includes an imaging device 201, a lens 202 that captures an optical image of an object onto the imaging device 201, an aperture 204 for changing a light amount passing through the lens 202, and a barrier 206 for protecting the lens 202. The lens 202 and the aperture 204 form an optical system that converges a light onto the imaging device 201. The imaging device 201 is the photoelectric conversion device 100 described in any of the first to fourth embodiments and converts an optical image captured by the lens 202 into image data.

The imaging system 200 further includes a signal processing unit 208 that processes an output signal output from the imaging device 201. The signal processing unit 208 preforms analog-to-digital (AD) conversion that converts an analog signal output by the imaging device 201 into a digital signal. In addition, the signal processing unit 208 performs various correction and compression other than the above, if necessary, and outputs image data. An AD conversion unit, which is a part of the signal processing unit 208, may be formed on a semiconductor substrate on which the imaging device 201 is provided or a semiconductor substrate on which the imaging device 201 is not provided. Further, the imaging device 201 and the signal processing unit 208 may be formed on the same semiconductor substrate.

The imaging system 200 further includes a memory unit 210 for temporarily storing image data therein and an external interface unit (external I/F unit) 212 for communicating with an external computer or the like. The imaging system 200 further includes a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

The imaging system 200 further includes a general control/operation unit 218 that controls various operations and the entire digital still camera and a timing generation unit 220 that outputs various timing signals to the imaging device 201 and the signal processing unit 208. Here, the timing signal or the like may be input from the outside, and the imaging system 200 may include at least the imaging device 201 and the signal processing unit 208 that processes an output signal output from the imaging device 201.

When the imaging system 200 is configured as an image reading apparatus such as a copying machine, a fax machine, a scanner, or the like, a motion mechanism that causes relative movement of the object (for example, a document) and the imaging device 201 may be further provided.

The imaging device 201 outputs an imaging signal to the signal processing unit 208. The signal processing unit 208 performs predetermined signal processing on an imaging signal output from the imaging device 201 and outputs image data. The signal processing unit 208 uses an imaging signal to generate an image.

As discussed above, according to the present embodiment, the imaging system to which the photoelectric conversion device 100 according to the first to fourth embodiments is applied can be implemented.

Sixth Embodiment

Figure 15A:
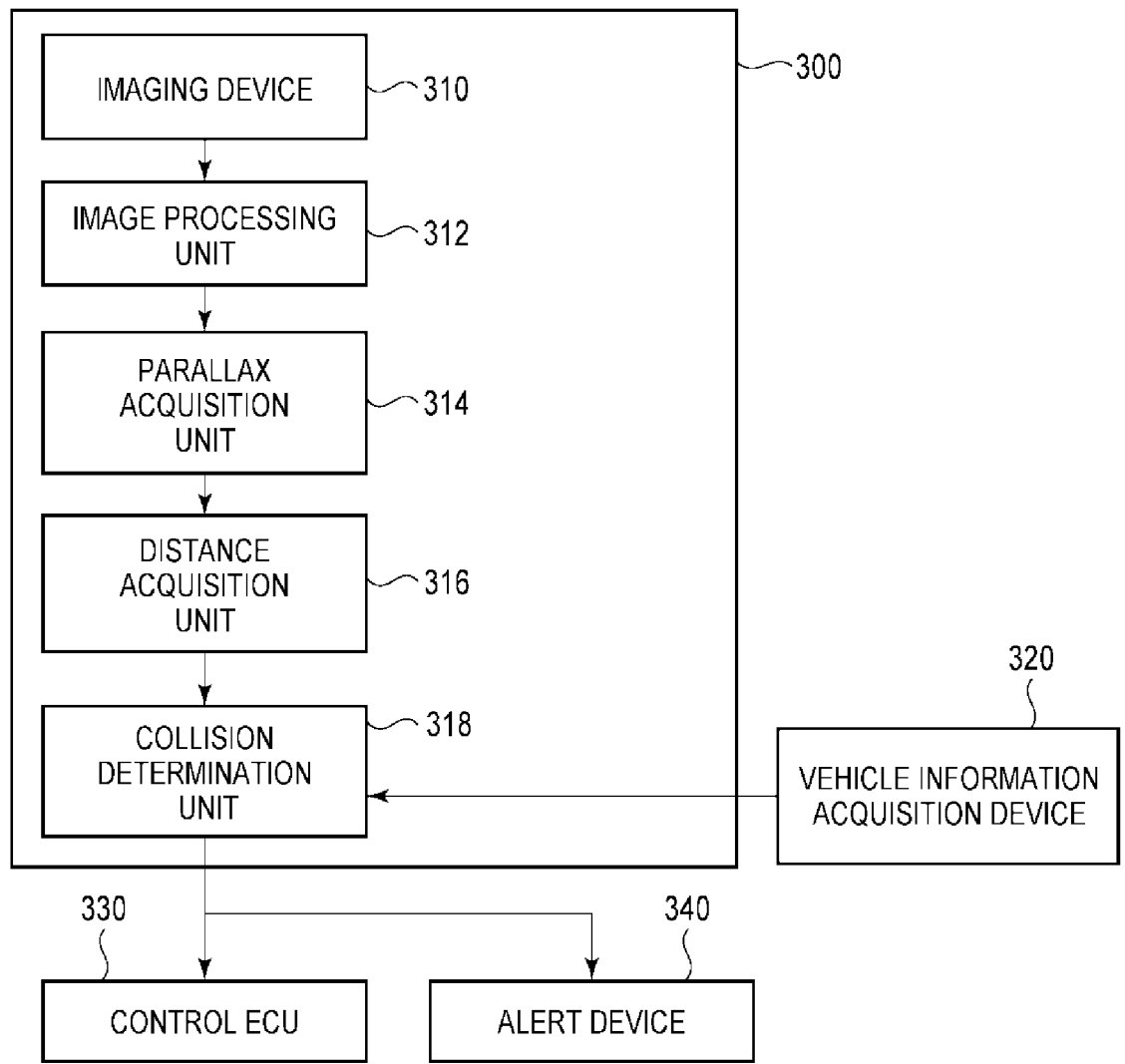
FIG. 15A is a diagram illustrating a configuration example of an imaging system and a movable object according to a sixth embodiment of the present invention.
Figure 15B:
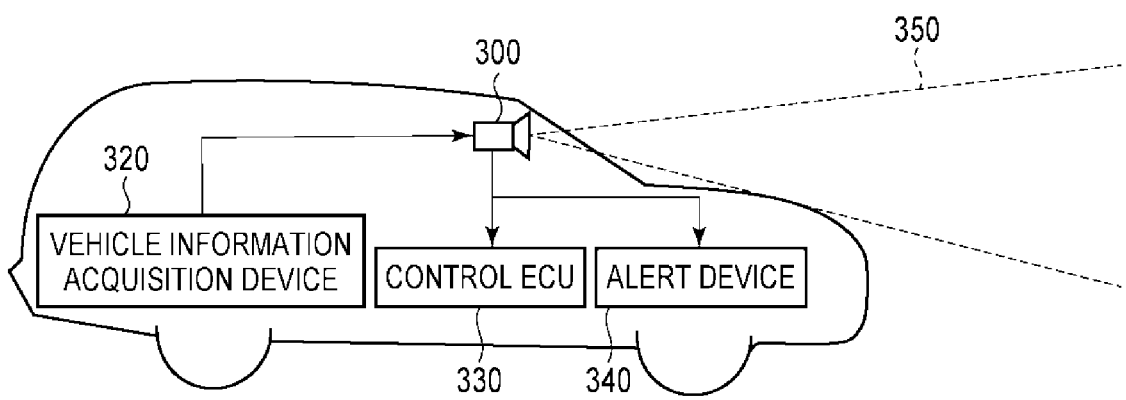
FIG. 15B is a diagram illustrating a configuration example of the movable object according to the sixth embodiment of the present invention.

An imaging system and a movable object according to a sixth embodiment of the present invention will be described by with reference to FIG. 15A and FIG. 15B. FIG. 15A is a diagram illustrating the configuration of an imaging system according to the present embodiment. FIG. 15B is a diagram illustrating the configuration of a movable object according to the present embodiment.

FIG. 15A illustrates an example of an imaging system related to an on-vehicle camera. An imaging system 300 includes an imaging device 310. The imaging device 310 is the photoelectric conversion device 100 described in any of the first to fourth embodiments described above. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 includes a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a field programmable gate array (FPGA), an application specific integrated circuit (ASIC), or the like or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 15B illustrates the imaging system when a front area of a vehicle (a capturing area 350) is captured. The vehicle information acquisition device 320 transmits an instruction to the imaging system 300 or the imaging device 310. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is one of the embodiments of the present invention.

Further, while the pixel region 14 is divided into five pixel groups or three pixel groups in the division direction of an exposure area and the arrangement pitch of the pixels 22 is different between adjacent pixel groups in the embodiments described above, the number of pixel groups divided from the pixel region 14 is not limited thereto.

Further, while the arrangement pitch of the pixels 22 changes stepwise in the division direction of an exposure area in the embodiments described above, the arrangement pitch of the pixels 22 may be configured to change continuously.

Further, while the embodiments described above have been illustrated with the metal layer 42 as a representative example as a layer defining the arrangement pitch of the pixels 22, the pattern may be appropriately changed in accordance with the arrangement pitch of the pixels 22 also in photolithography of other layers. For example, the position of the photoelectric converter PD can be determined on a pixel 22 basis taking the position of the micro-lens 60 or the opening region of the metal layer 42 into consideration.

Further, the photoelectric conversion device illustrated in the embodiments described above can be used as a device intended for acquisition of an image, that is, an imaging device. Further, an application example of the photoelectric conversion device illustrated in the embodiment described above is not necessarily limited to an imaging device, and the photoelectric conversion device is not necessarily required to output an image when applied to a device intended for ranging as described in the above sixth embodiment, for example. In such a case, it can be said that such a device is a photoelectric conversion device that convers optical information into a predetermined electrical signal. An imaging device is one of the photoelectric conversion devices.

Further, the imaging systems illustrated in the fifth and sixth embodiments described above are examples of an imaging system to which the photoelectric conversion device of the present invention may be applied, and an imaging system to which the photoelectric conversion device of the present invention can be applied is not limited to the configuration illustrated in FIG. 14 and FIG. 15A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-033885, filed Feb. 27, 2019, which is hereby incorporated by reference herein in its entirety.

What is claimed is:

1. A photoelectric conversion device comprising:
a pixel region in which a plurality of pixels each including a photoelectric converter is arranged;
a plurality of micro-lenses each corresponding to each of the plurality of pixels; and
a plurality of color filters each corresponding to each of the plurality of pixels,
wherein the pixel region includes a first region and a second region that are adjacent to each other,
wherein out of the plurality of pixels, a first pixel in the first region and a second pixel in the second region that are adjacent to each other in a direction in which the first region and the second region are aligned are arranged at a first arrangement pitch,
wherein out of the plurality of pixels, two pixels in the first region that are adjacent to each other in the direction are arranged at a second arrangement pitch,
wherein out of the plurality of pixels, two pixels in the second region that are adjacent to each other in the direction are arranged at a third arrangement pitch,
wherein the second arrangement pitch and the third arrangement pitch are smaller than the first arrangement pitch,
wherein out of the plurality of micro-lenses, an arrangement pitch of two micro-lenses corresponding to the pixel in the first region and the pixel in the second region that are adjacent to each other is smaller than the first arrangement pitch, and
wherein out of the plurality of color filters, an arrangement pitch of two color filters corresponding to the first pixel and the second pixel, respectively, is smaller than the first arrangement pitch.

2. The photoelectric conversion device according to claim 1,
wherein out of the plurality of micro-lenses, an arrangement pitch of two micro-lenses corresponding to the two pixels in the first region that are adjacent to each other is smaller than the second arrangement pitch, and
wherein out of the plurality of micro-lenses, an arrangement pitch of two micro-lenses corresponding to the two pixels in the second region that are adjacent to each other is smaller than the third arrangement pitch.

3. The photoelectric conversion device according to claim 2, wherein an average arrangement pitch of the plurality of micro-lenses in the pixel region is larger than the second arrangement pitch and the third arrangement pitch.

4. The photoelectric conversion device according to claim 1, wherein an average arrangement pitch of the plurality of micro-lenses in the pixel region is larger than the second arrangement pitch and the third arrangement pitch.

5. The photoelectric conversion device according to claim 1, wherein the color filters of three pixels arranged in the direction have different transmission wavelength bands from each other.

6. The photoelectric conversion device according to claim 1,
wherein the first region includes a third region and a fourth region, and the third region is located between the second region and the fourth region,
wherein the second region includes a fifth region and a sixth region, and the fifth region is located between the first region and the sixth region,
wherein the third region and the fifth region are adjacent to each other in the direction,
wherein out of the plurality of pixels, two pixels in the third region that are adjacent to each other in the direction and two pixels in the fifth region that are adjacent to each other in the direction are aligned at the second arrangement pitch, and
wherein out of the plurality of pixels, two pixels in the fourth region that are adjacent to each other in the direction and two pixels in the sixth region that are adjacent to each other in the direction are aligned at the fourth arrangement pitch that is smaller than the first arrangement pitch and larger than the second arrangement pitch.

7. The photoelectric conversion device according to claim 6, wherein the third region and the fifth region are located at the center of the pixel region with respect to the direction and provided in an area occupying an area of 10% or less of the pixel region.

8. The photoelectric conversion device according to claim 1, wherein the second arrangement pitch and the third arrangement pitch are equal to each other.

9. An imaging system comprising:
the photoelectric conversion device according to claim 1; and
a signal processing unit that processes signals output from the pixels of the photoelectric conversion device.

10. An image reading apparatus comprising:
the photoelectric conversion device according to claim 1; and
a motion mechanism that causes relative movement of an object and the photoelectric conversion device.

11. The photoelectric conversion device according to claim 1, wherein a length of a semiconductor substrate having the photoelectric converter is larger than 35 mm in the direction.

12. A photoelectric conversion device comprising:
a pixel region in which a plurality of pixels each including a photoelectric converter is arranged; and
a plurality of micro-lenses each corresponding to each of the plurality of pixels, wherein the pixel region includes a first region and a second region that are adjacent to each other, wherein out of the plurality of pixels, a first pixel in the first region and a second pixel in the second region that are adjacent to each other in a direction in which the first region and the second region are aligned are arranged at a first arrangement pitch, wherein out of the plurality of pixels, two pixels in the first region that are adjacent to each other in the direction are arranged at a second arrangement pitch, wherein out of the plurality of pixels, two pixels in the second region that are adjacent to each other in the direction are arranged at a third arrangement pitch, wherein the second arrangement pitch and the third arrangement pitch are smaller than the first arrangement pitch, wherein out of the plurality of micro-lenses, an arrangement pitch of two micro-lenses corresponding to the pixel in the first region and the pixel in the second region that are adjacent to each other is smaller than the first arrangement pitch, and wherein a width of a first element isolation region arranged between a photoelectric converter of the first pixel and a photoelectric converter of the second pixel is larger than a width of a second element isolation region arranged between respective photoelectric converters of the two pixels in the first region and a width of a third element isolation region arranged between respective photoelectric converters of the two pixels in the second region.

13. The photoelectric conversion device according to claim 12, wherein each of the first element isolation region, the second element isolation region and the third element isolation region is made of an insulating member.

14. The photoelectric conversion device according to claim 12, wherein a length of a semiconductor substrate having the photoelectric converter is larger than 35 mm in the direction.

15. The photoelectric conversion device according to claim 1, wherein a length of the pixel region is larger than 33 mm in the direction.

16. The photoelectric conversion device according to claim 12, wherein a length of the pixel region is larger than 33 mm in the direction.

17. The photoelectric conversion device according to claim 12 further comprising a plurality of color filters each corresponding to each of the plurality of pixels, wherein out of the plurality of color filters, an arrangement pitch of two color filters corresponding to the first pixel and the second pixel, respectively, is smaller than the first arrangement pitch.

18. An imaging system comprising:
the photoelectric conversion device according to claim 12; and
a signal processing unit that processes signals output from the pixels of the photoelectric conversion device.

19. An image reading apparatus comprising:
the photoelectric conversion device according to claim 12; and
a motion mechanism that causes relative movement of an object and the photoelectric conversion device.

20. A photoelectric conversion device comprising:
a pixel region in which a plurality of pixels each including a photoelectric converter is arranged; and
a plurality of micro-lenses each corresponding to each of the plurality of pixels, wherein the pixel region includes a first region and a second region that are adjacent to each other, wherein out of the plurality of pixels, a first pixel in the first region and a second pixel in the second region that are adjacent to each other in a direction in which the first region and the second region are aligned are arranged at a first arrangement pitch, wherein out of the plurality of pixels, two pixels in the first region that are adjacent to each other in the direction are arranged at a second arrangement pitch, wherein out of the plurality of pixels, two pixels in the second region that are adjacent to each other in the direction are arranged at a third arrangement pitch, wherein the second arrangement pitch and the third arrangement pitch are smaller than the first arrangement pitch, wherein out of the plurality of micro-lenses, an arrangement pitch of two micro-lenses corresponding to the pixel in the first region and the pixel in the second region that are adjacent to each other is smaller than the first arrangement pitch, wherein each of the plurality of pixels includes an opening region defined by a metal layer used for taking an incident light into the photoelectric converter, and wherein a boundary of the first region and the second region is located between opening regions of pixels that are adjacent in the direction.

21. The photoelectric conversion device according to claim 20, wherein areas of the opening regions of the plurality of pixels are the same.

22. The photoelectric conversion device according to claim 20, wherein the first arrangement pitch, the second arrangement pitch, and the third arrangement pitch are defined by a spacing of patterns of the metal layers of pixels that are adjacent to each other in the direction.

23. The photoelectric conversion device according to claim 20, wherein each of the metal layers is a power supply line used for supplying a power supply voltage to the pixels or an output line used for outputting signals of the pixels.

24. The photoelectric conversion device according to claim 20, wherein a length of a semiconductor substrate having the photoelectric converter is larger than 35 mm in the direction.

25. The photoelectric conversion device according to claim 20, wherein a length of the pixel region is larger than 33 mm in the direction.

26. The photoelectric conversion device according to claim 20 further comprising a plurality of color filters each corresponding to each of the plurality of pixels, wherein out of the plurality of color filters, an arrangement pitch of two color filters corresponding to the first pixel and the second pixel, respectively, is smaller than the first arrangement pitch.

27. An imaging system comprising:
the photoelectric conversion device according to claim 20; and
a signal processing unit that processes signals output from the pixels of the photoelectric conversion device.

28. An image reading apparatus comprising:
the photoelectric conversion device according to claim 20; and
a motion mechanism that causes relative movement of an object and the photoelectric conversion device.

29. A photoelectric conversion device comprising:
a pixel region in which a plurality of pixels each including a photoelectric converter is arranged; and a plurality of micro-lenses each corresponding to each of the plurality of pixels, wherein the pixel region includes a first region and a second region that are adjacent to each other, wherein out of the plurality of pixels, a first pixel in the first region and a second pixel in the second region that are adjacent to each other in a direction in which the first region and the second region are aligned are arranged at a first arrangement pitch, wherein out of the plurality of pixels, two pixels in the first region that are adjacent to each other in the direction are arranged at a second arrangement pitch, wherein out of the plurality of pixels, two pixels in the second region that are adjacent to each other in the direction are arranged at a third arrangement pitch, wherein the second arrangement pitch and the third arrangement pitch are smaller than the first arrangement pitch, wherein out of the plurality of micro-lenses, an arrangement pitch of two micro-lenses corresponding to the pixel in the first region and the pixel in the second region that are adjacent to each other is smaller than the first arrangement pitch, and wherein a length of a semiconductor substrate having the photoelectric converter is larger than 35 mm in the direction.

30. An imaging system comprising:
the photoelectric conversion device according to claim 29; and
a signal processing unit that processes signals output from the pixels of the photoelectric conversion device.

31. An image reading apparatus comprising:
the photoelectric conversion device according to claim 29; and
a motion mechanism that causes relative movement of an object and the photoelectric conversion device.

32. A photoelectric conversion device comprising:
a pixel region in which a plurality of pixels each including a photoelectric converter is arranged; and
a plurality of micro-lenses each corresponding to each of the plurality of pixels, wherein the pixel region includes a first region and a second region that are adjacent to each other, wherein out of the plurality of pixels, a first pixel in the first region and a second pixel in the second region that are adjacent to each other in a direction in which the first region and the second region are aligned are arranged at a first arrangement pitch, wherein out of the plurality of pixels, two pixels in the first region that are adjacent to each other in the direction are arranged at a second arrangement pitch, wherein out of the plurality of pixels, two pixels in the second region that are adjacent to each other in the direction are arranged at a third arrangement pitch, wherein the second arrangement pitch and the third arrangement pitch are smaller than the first arrangement pitch, wherein out of the plurality of micro-lenses, an arrangement pitch of two micro-lenses corresponding to the pixel in the first region and the pixel in the second region that are adjacent to each other is smaller than the first arrangement pitch, and wherein a length of the pixel region is larger than 33 mm in the direction.

33. The photoelectric conversion device according to claim 32, wherein a length of a semiconductor substrate having the photoelectric converter is larger than 35 mm in the direction.

34. An imaging system comprising:
the photoelectric conversion device according to claim 32; and
a signal processing unit that processes signals output from the pixels of the photoelectric conversion device.

35. An image reading apparatus comprising:
the photoelectric conversion device according to claim 32; and
a motion mechanism that causes relative movement of an object and the photoelectric conversion device.

36. A method of manufacturing a photoelectric conversion device comprising:
performing a pattern exposure of the same layer by using separate photomasks on a first region and a second region that are adjacent to each other to form a plurality of pixels each including a photoelectric converter and a plurality of micro-lenses each corresponding to each of the plurality of pixels in a pixel region including the first region and the second region, wherein a photomask used for performing pattern exposure on the first region and a photomask used for performing pattern exposure on the second region are designed such that a pixel in the first region and a pixel in the second region that are adjacent to each other in a direction in which the first region and the second region are aligned are arranged at a first arrangement pitch, two pixels in the first region that are adjacent to each other in the direction are arranged at a second arrangement pitch that is smaller than the first arrangement pitch, two pixels in the second region that are adjacent to each other in the direction are arranged at a third arrangement pitch that is smaller than the first arrangement pitch, and out of the plurality of micro-lenses, an arrangement pitch of two micro-lenses corresponding to the pixel in the first region and the pixel in the second region that are adjacent to each other is smaller than the first arrangement pitch.

37. A photoelectric conversion device comprising:
a pixel region in which a plurality of pixels each including a photoelectric converter is arranged; and
a plurality of micro-lenses each corresponding to each of the plurality of pixels, wherein the pixel region includes a first region and a second region that are adjacent to each other, wherein out of the plurality of pixels, a first pixel in the first region and a second pixel in the second region that are adjacent to each other in a direction in which the first region and the second region are aligned are arranged at a first arrangement pitch, wherein out of the plurality of pixels, two pixels in the first region that are adjacent to each other in the direction are arranged at a second arrangement pitch, wherein out of the plurality of pixels, two pixels in the second region that are adjacent to each other in the direction are arranged at a third arrangement pitch, wherein the second arrangement pitch and the third arrangement pitch are smaller than the first arrangement pitch, and wherein a width of a first element isolation region arranged between a photoelectric converter of the first pixel and a photoelectric converter of the second pixel is larger than a width of a second element isolation region arranged between respective photoelectric converters of the two pixels in the first region and a width of a third element isolation region arranged between respective photoelectric converters of the two pixels in the second region.

38. The photoelectric conversion device according to claim 37,
wherein each of the plurality of pixels includes an opening region defined by a metal layer used for taking an incident light into the photoelectric converter, and
wherein a boundary of the first region and the second region is located between opening regions of pixels that are adjacent in the direction.

39. The photoelectric conversion device according to claim 38, wherein areas of the opening regions of the plurality of pixels are the same.

40. The photoelectric conversion device according to claim 38, wherein the first arrangement pitch, the second arrangement pitch, and the third arrangement pitch are defined by a spacing of patterns of the metal layers of pixels that are adjacent to each other in the direction.

41. The photoelectric conversion device according to claim 38, wherein each of the metal layers is a power supply line used for supplying a power supply voltage to the pixels or an output line used for outputting signals of the pixels.

42. The photoelectric conversion device according to claim 37, wherein a length of a semiconductor substrate having the photoelectric converter is larger than 35 mm in the direction.

43. The photoelectric conversion device according to claim 37, wherein a length of the pixel region is larger than 33 mm in the direction.

44. The photoelectric conversion device according to claim 37, wherein the second arrangement pitch and the third arrangement pitch are equal to each other.

45. The photoelectric conversion device according to claim 37 further comprising a plurality of color filters each corresponding to each of the plurality of pixels,
wherein out of the plurality of color filters, an arrangement pitch of two color filters corresponding to the first pixel and the second pixel, respectively, is smaller than the first arrangement pitch.

46. An imaging system comprising:
the photoelectric conversion device according to claim 37; and
a signal processing unit that processes signals output from the pixels of the photoelectric conversion device.

47. An image reading apparatus comprising:
the photoelectric conversion device according to claim 37; and
a motion mechanism that causes relative movement of an object and the photoelectric conversion device.

* * * * *